United States Patent
Lai et al.

(10) Patent No.: US 9,431,417 B1
(45) Date of Patent: Aug. 30, 2016

(54) SEMICONDUCTOR STRUCTURE AND METHOD FOR MANUFACTURING THE SAME

(71) Applicant: MACRONIX INTERNATIONAL CO., LTD., Hsinchu (TW)

(72) Inventors: Erh-Kun Lai, Taichung (TW); Yen-Hao Shih, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/692,912

(22) Filed: Apr. 22, 2015

(51) Int. Cl.
*H01L 27/115* (2006.01)
*H01L 21/28* (2006.01)
*H01L 21/02* (2006.01)

(52) U.S. Cl.
CPC ... *H01L 27/11582* (2013.01); *H01L 21/02636* (2013.01); *H01L 21/28282* (2013.01)

(58) Field of Classification Search
CPC .................. H01L 21/02636; H01L 21/28282; H01L 27/11582
See application file for complete search history.

(56) References Cited

U.S. PATENT DOCUMENTS

2015/0318300 A1* 11/2015 Ohsaki ............. H01L 27/11582
438/258

* cited by examiner

*Primary Examiner* — Mamadou Diallo
(74) *Attorney, Agent, or Firm* — McClure, Qualey & Rodack, LLP

(57) ABSTRACT

A semiconductor structure and a method for manufacturing the same are provided. The semiconductor structure comprises a substrate, a plurality of stacks, a plurality of memory layers, a plurality of channel layers and a plurality of connecting portions. The stacks are disposed on the substrate. Each of the stacks comprises alternately-stacked conductive layers and insulating layers. The memory layers are disposed on sidewalls of the stacks, respectively. The channel layers are disposed on the memory layers, respectively, wherein each of the channel layers comprises a surface being exposed. The connecting portions connect the surface of each of the channel layers to the substrate, respectively.

12 Claims, 26 Drawing Sheets

SEMICONDUCTOR STRUCTURE AND METHOD FOR MANUFACTURING THE SAME

TECHNICAL FIELD

This disclosure relates to a semiconductor structure and a method for manufacturing the same. More particularly, this disclosure relates to a semiconductor structure, in which a channel layer is connected to a substrate, and a method for manufacturing the same.

BACKGROUND

For decreasing volume and weight, increasing power density, improving portability, and the like reasons, people in the industry have made every effort to increasing the density of semiconductor devices. One way to achieve this is using a 3D structure instead of a conventional 2D structure. A 3D semiconductor structure may comprise a plurality of stacks formed on the substrate. Theses stacks are separated from each other by high aspect ratio trenches or holes. Some structures may be formed in the trenches or holes along the sidewalls of the stacks and/or on the bottom of the trenches or holes. However, as the height of the stacks increases, some problems relating these structures may emerge. For example, such structures will be harder to form and keep their desired configurations.

SUMMARY

This disclosure relates to a semiconductor structure, in which the structures formed on a sidewall of the stack are concerned, and a method for manufacturing the same.

According to some embodiment, a method for manufacturing a semiconductor structure is provided. The method comprises following steps. First, a plurality of stacks are formed on a substrate. A plurality of memory layers are formed on sidewalls of the stacks, respectively. A plurality of channel layers are formed on the memory layers, respectively, and a surface of each of the channel layers is exposed. Thereafter, a plurality of connecting portions are formed connecting the surface of each of the channel layers to the substrate, respectively.

According to some embodiment, a semiconductor structure is provided. The semiconductor structure comprises a substrate, a plurality of stacks, a plurality of memory layers, a plurality of channel layers and a plurality of connecting portions. The stacks are disposed on the substrate. Each of the stacks comprises alternately-stacked conductive layers and insulating layers. The memory layers are disposed on sidewalls of the stacks, respectively. The channel layers are disposed on the memory layers, respectively, wherein each of the channel layers comprises a surface being exposed. The connecting portions connect the surface of each of the channel layers to the substrate, respectively.

Figure 1A:
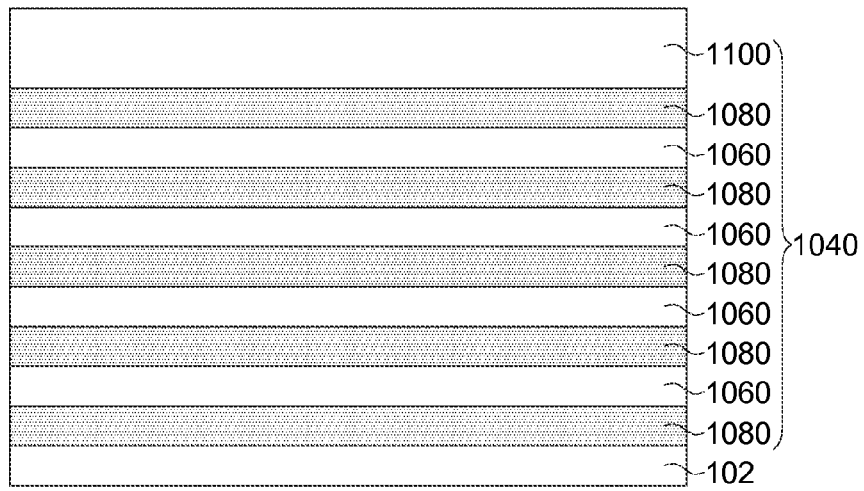
FIGS. 1A-1H illustrate a method for manufacturing a semiconductor structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the disclosure is directed to a method for manufacturing a semiconductor structure, in which the structures formed on a sidewall of the stack are concerned, and a semiconductor structure manufactured thereby. The method comprises at least following steps. First, a plurality of stacks are formed on a substrate. A plurality of memory layers are formed on sidewalls of the stacks, respectively. A plurality of channel layers are formed on the memory layers, respectively, and a surface of each of the channel layers is exposed. Thereafter, a plurality of connecting portions are formed connecting the surface of each of the channel layers to the substrate, respectively.

FIGS. 1A-1H illustrate a method for manufacturing a semiconductor structure according to one embodiment. Referring to FIG. 1A, a substrate 102 is provided. The substrate 102 may be formed of silicon and be p-type doped. A stack 1040 is formed on the substrate 102. In this embodiment, the stack 1040 comprises a plurality of sacrificial layers 1060 and a plurality of insulating layers 1080 alternately stacked on the substrate 102. The sacrificial layers 1060 may be formed of silicon nitride (SiN), and the insulating layers 1080 may be formed of oxide. In an alternate embodiment, the sacrificial layers 1060 may be replaced by conductive layers, which is formed of, for example, doped polysilicon. Optionally, the stack 1040 may further comprise a hard mask layer 1100 formed on the top of the sacrificial layers 1060 and the insulating layers 1080. The hard mask layer 1100 may be formed of SiN. The hard mask layer 1100 formed of SiN can prevent the bending or collapse of the stack 1040. Further, it may work as the stopping layer in a chemical mechanical polishing (CMP) process.

Figure 1B:
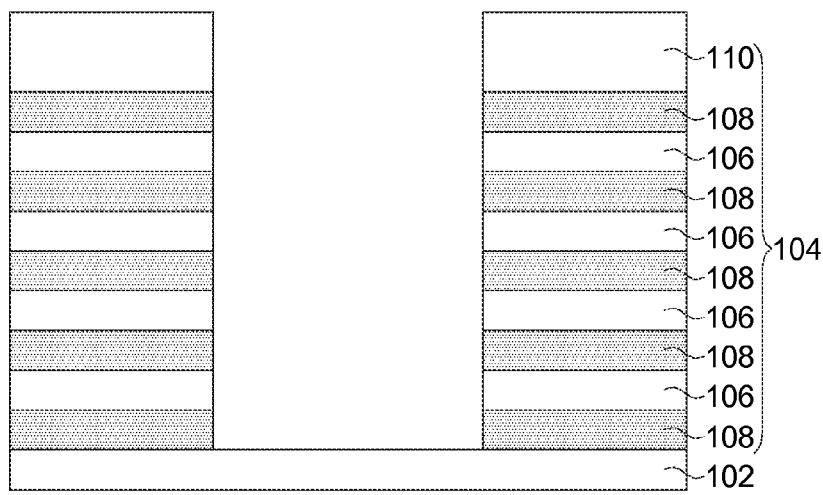
Figure 1C:
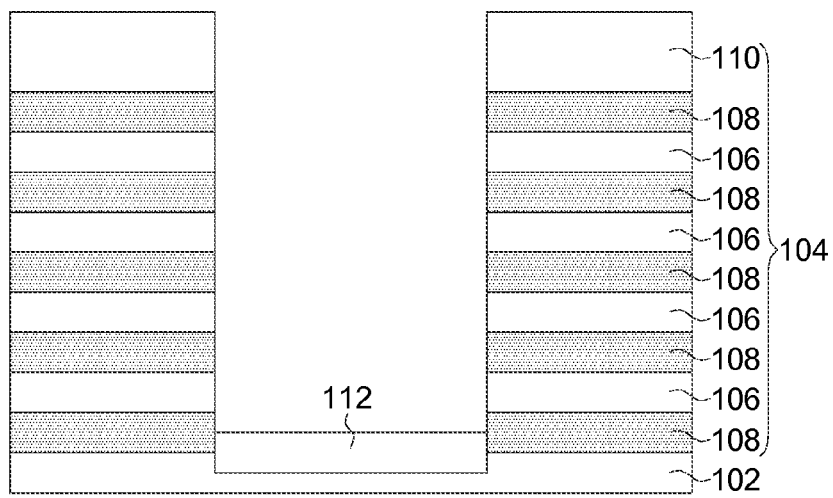

Referring to FIG. 1B, the stack 1040 is patterned. As such, a plurality of stacks 104 are formed on the substrate 102. Each of the stacks 104 comprises alternately-stacked sacrificial layers 106 and insulating layers 108, and an optional hard mask layer 110. In one embodiment, as shown in FIG. 1C, a plurality of selective epitaxial growth (SEG) layers 112 may be formed on the substrate 102 between the stacks 104. The SEG layers 112 are formed of undoped polysilicon. By the disposition of the SEG layers 112, a resistance of the source line may be decreased when it is turned on. The SEG layers 112, while may still exist, will not be shown in the following figures.

Figure 1D:
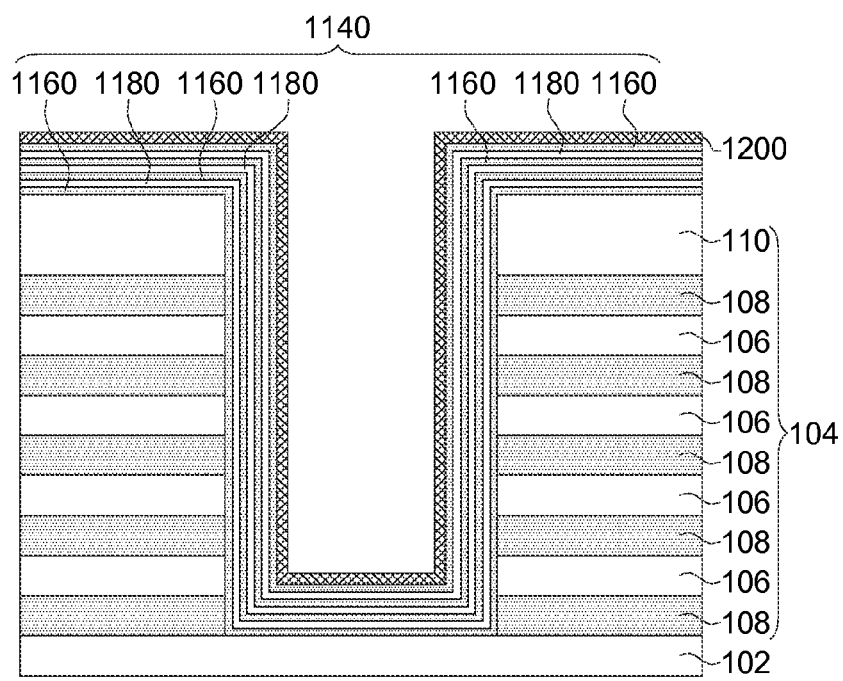

Referring to FIG. 1D, a conformal memory layer 1140 is formed over the stacks 104. In one embodiment, the conformal memory layer 1140 comprises a blocking layer, a trapping layer and a tunneling layer. The conformal memory layer 1140 may have an oxide-nitride-oxide (ONO) structure, an oxide-nitride-oxide-nitride-oxide (ONONO) structure, an oxide-nitride-oxide-nitride-oxide-nitride-oxide (ONONONO) structure, or the like. In the figures, the ONONONO structure comprising oxide layers 1160 and nitride layers 1180 is illustrated. A conformal channel layer 1200 is formed over the conformal memory layer 1140. The conformal channel layer 1200 may be formed of polysilicon. In one example, the conformal channel layer 1200 has a thickness of about 150 Å. The conformal memory layer 1140 and the conformal channel layer 1200 may be formed by deposition.

Figure 1E:
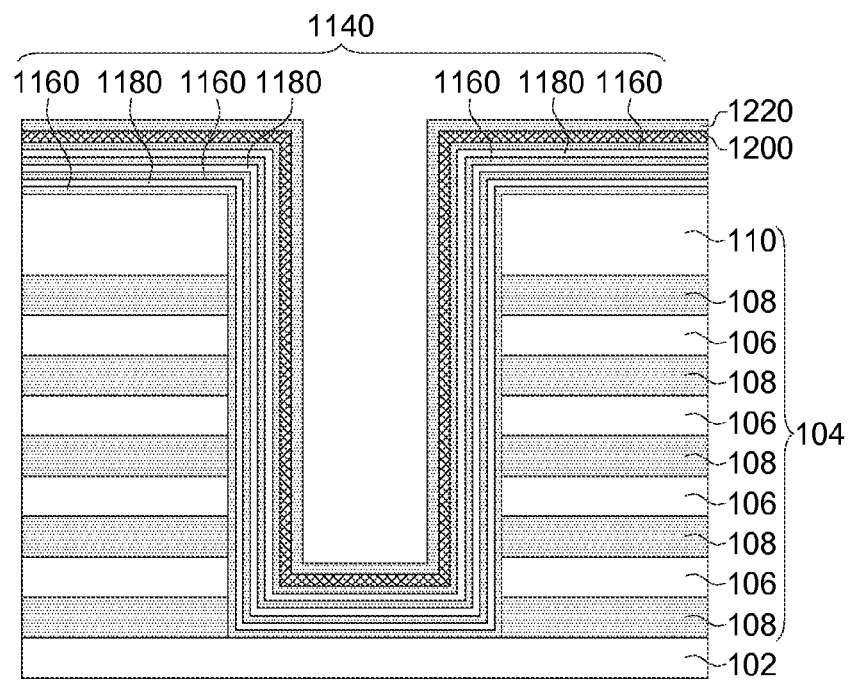

Referring to FIG. 1E, a spacer layer 1220 is formed on the conformal channel layer 1200. According to one embodiment, the spacer layer 1220 may be formed by oxidizing the conformal channel layer 1200. As such, in the previous step, the polysilicon layer being deposited can be thicker. Further, during the oxidation process, polysilicon grains may grow. The larger grains are beneficial for a higher mobility, and thereby a higher cell current is obtained. In one example, after the oxidation process, the remaining conformal channel layer 1200 has a thickness of about 100 Å, and the spacer layer 1220 being formed has a thickness of about 110 Å. In an alternate embodiment, the spacer layer 1220 may be formed by depositing an oxide. The oxide layer can protect the polysilicon layer thereunder.

Figure 1F:
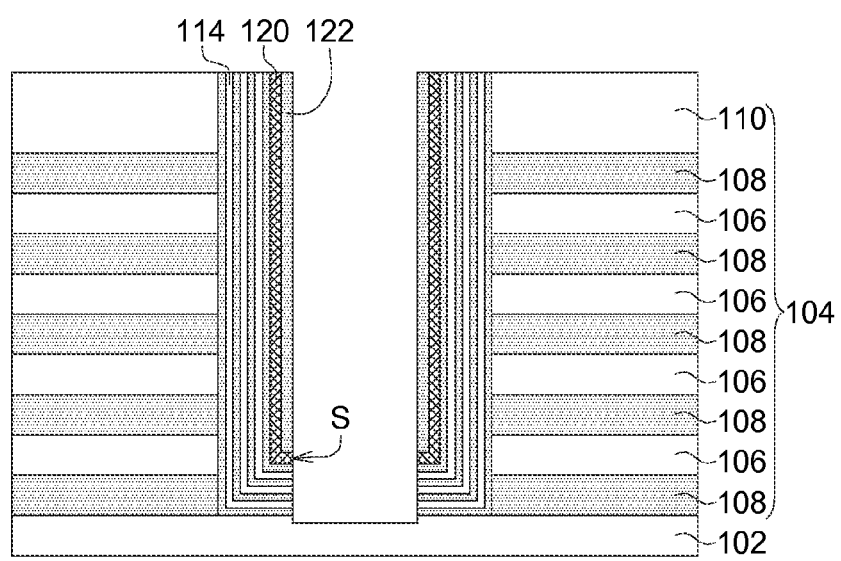

Referring to FIG. 1F, the spacer layer 1220, the conformal channel layer 1200 and the conformal memory layer 1140 are separated. As such, memory layers 114, channel layers 120 and spacers 122 are formed. The memory layers 114 are formed on sidewalls of the stacks 104, respectively. The channel layers 120 are formed on the memory layers 114, respectively. At this time, a surface S of each of the channel layers 120 is exposed. The spacers 122 are formed on the channel layers 120, respectively. The separation process may be conducted by etching, such as dry etching.

Figure 1G:
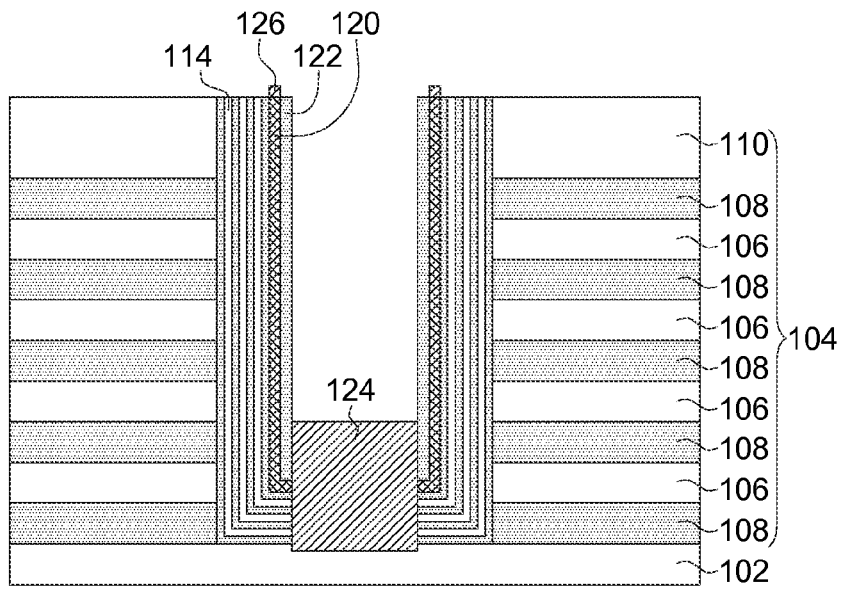

Referring to FIG. 1G, a SEG process is conducted, and thereby a plurality of connecting portions 124 are formed. The connecting portions 124 connect the surface S of each of the channel layers 120 to the substrate 102, respectively. The connecting portions 124 are SEG layers formed of undoped silicon growing from the silicon substrate 102. Concurrently, SEG layers 126 may be formed on the polysilicon channel layers 120. In one embodiment, before the SEG process, a dip process using dilute hydrofluoric acid (DHF) may be optionally conducted to remove naturally growing oxide. However, the spacers 122 formed of oxide should keep intact.

Figure 1H:
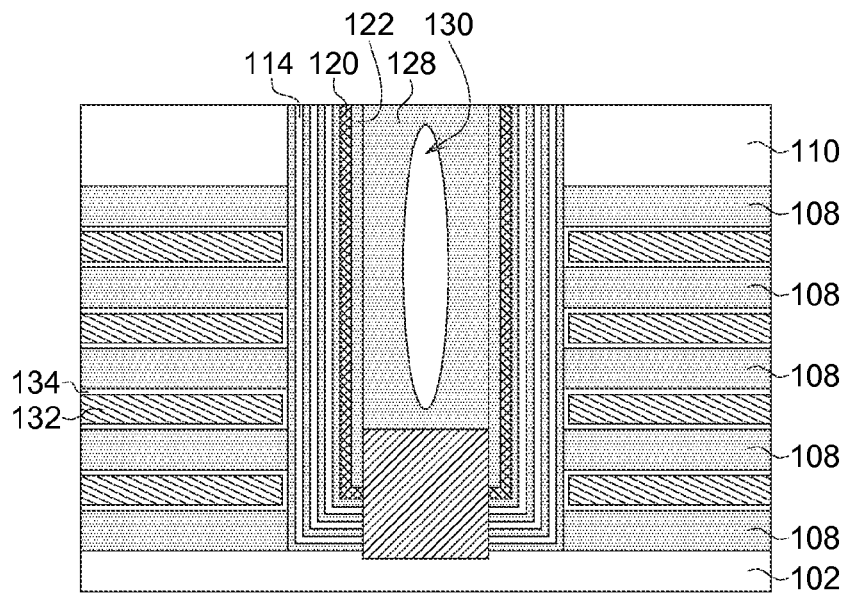

Various processes can be conducted thereafter. In one embodiment, as shown in FIG. 1H, an oxide 128 is filled into the spaces between the stacks 104, wherein an air gap 130 may be formed in the oxide 128. Besides, the SEG layers 126 formed on the channel layers 120 may be removed by a CMP process relating to the oxide 128. Further, in the embodiment illustrated in FIGS. 1A-1H, the sacrificial layers 106 in the stacks 104 may be replaced by conductive layers 132. The conductive layers 132 may be formed of metal, such as tungsten (W). In addition, a barrier layer 134 such as formed by TiN may be formed.

The semiconductor structure manufactured by the method according to this embodiment comprises a substrate 102, a plurality of stacks 104, a plurality of memory layers 114, a plurality of channel layers 120 and a plurality of connecting portions 124. The stacks 104 are disposed on the substrate 102. Each of the stacks 104 comprises alternately-stacked conductive layers 132 and insulating layers 108. The memory layers 114 are disposed on sidewalls of the stacks 104, respectively. The channel layers 120 are disposed on the memory layers 114, respectively, wherein each of the channel layers 120 comprises a surface S being exposed. In one embodiment, the semiconductor structure may further comprise a plurality of spacers 122 disposed on the channel layers 120, respectively. The connecting portions 124 connect the surface S of each of the channel layers 120 to the substrate 102, respectively. In this embodiment, the connecting portions 124 are SEG layers. For simplicity, other features are not reproduced here.

Figure 2A:
FIGS. 2A-2I illustrate a method for manufacturing a semiconductor structure according to one embodiment.

FIGS. 2A-2I illustrate a method for manufacturing a semiconductor structure according to another embodiment. Referring to FIG. 2A, a substrate 202 is provided. The substrate 202 may be formed of silicon and be p-type doped. A stack 2040 is formed on the substrate 202. In this embodiment, the stack 2040 comprises a plurality of sacrificial layers 2060 and a plurality of insulating layers 2080 alternately stacked on the substrate 202. The sacrificial layers 2060 may be formed of SiN, and the insulating layers 2080 may be formed of oxide. Optionally, the stack 2040 may further comprise a hard mask layer 2100 formed on the top of the sacrificial layers 2060 and the insulating layers 2080.

Figure 2B:
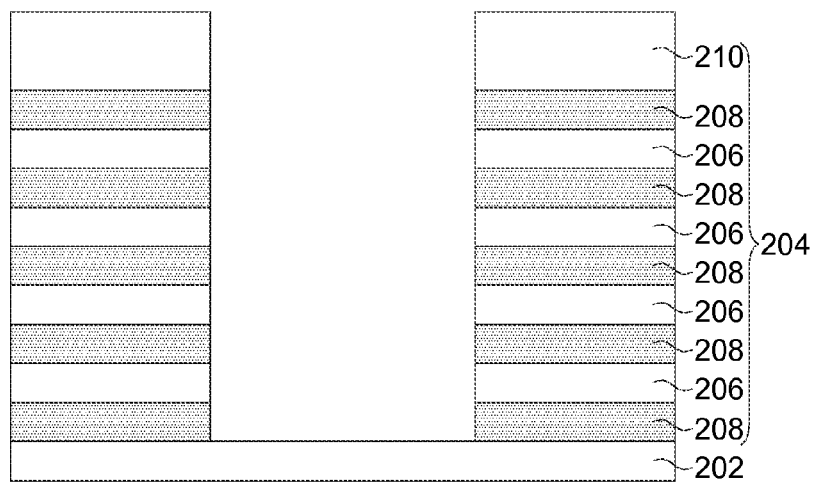
Figure 2C:
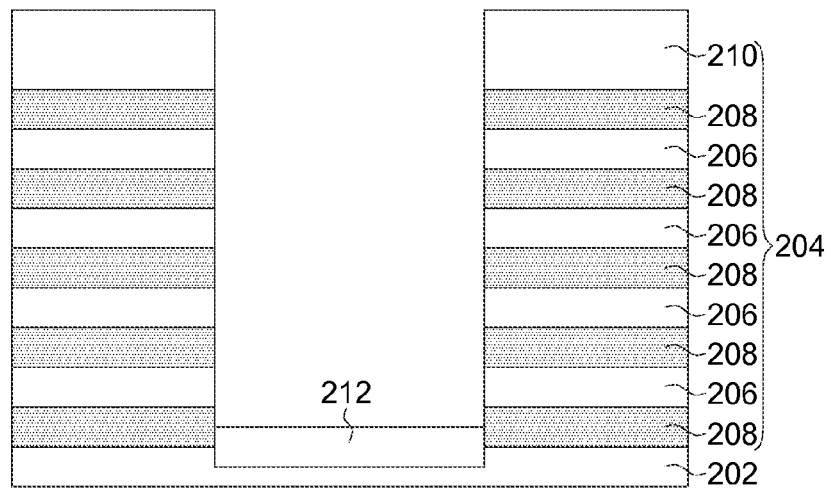

Referring to FIG. 2B, the stack 2040 is patterned. As such, a plurality of stacks 204 are formed on the substrate 202. Each of the stacks 204 comprises alternately-stacked sacrificial layers 206 and insulating layers 208, and an optional hard mask layer 210. In one embodiment, as shown in FIG. 2C, a plurality of SEG layers 212 may be formed on the substrate 202 between the stacks 204. The SEG layers 212 are formed of undoped polysilicon. The SEG layers 212, while may still exist, will not be shown in the following figures.

Figure 2D:
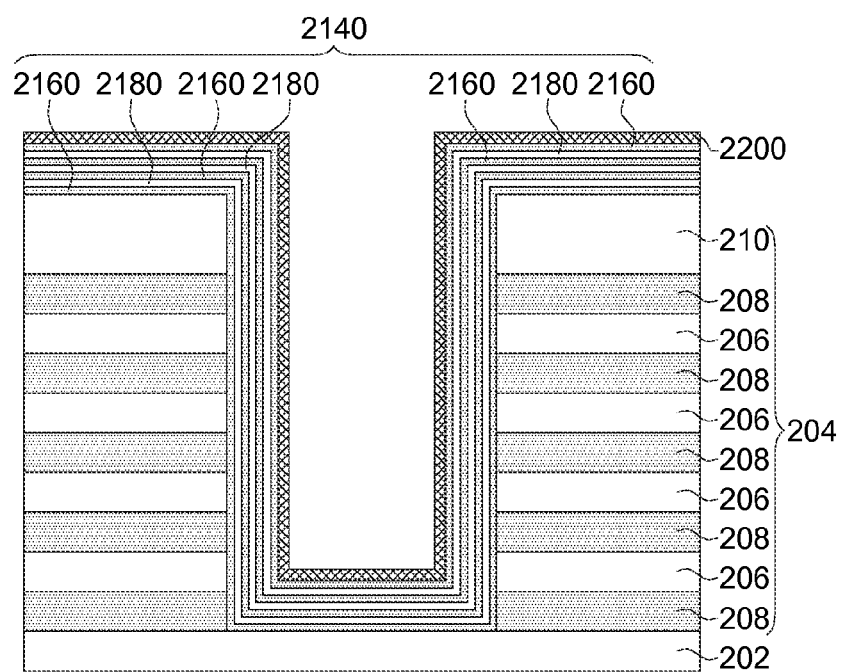

Referring to FIG. 2D, a conformal memory layer 2140 is formed over the stacks 204. In one embodiment, the conformal memory layer 2140 comprises a blocking layer, a trapping layer and a tunneling layer. The conformal memory layer 2140 may have an ONO structure, an ONONO structure, an ONONONO structure, or the like. In the figures, the ONONONO structure comprising oxide layers 2160 and nitride layers 2180 is illustrated. A conformal channel layer 2200 is formed over the conformal memory layer 2140. The conformal channel layer 2200 may be formed of polysilicon. Since another polysilicon layer will be formed in the following steps of this embodiment, the thickness of the conformal channel layer 2200 may be thinner than the thickness of the conformal channel layer 1200. In one example, the conformal channel layer 2200 has a thickness of about 100 Å. The conformal memory layer 2140 and the conformal channel layer 2200 may be formed by deposition.

Figure 2E:
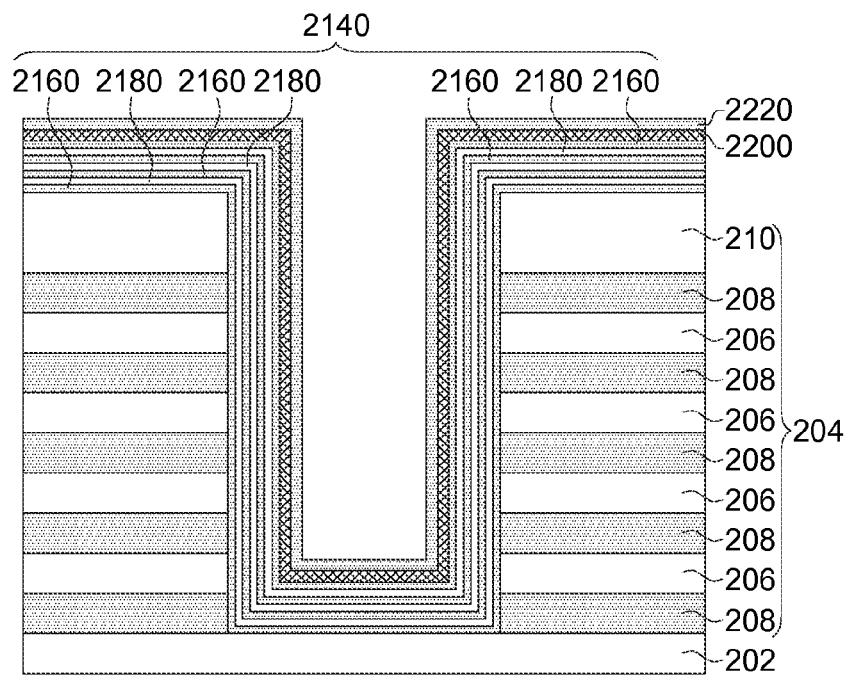

Referring to FIG. 2E, a spacer layer 2220 is formed on the conformal channel layer 2200. According to one embodiment, the spacer layer 2220 may be formed by oxidizing the conformal channel layer 2200. In one example, after the oxidation process, the remaining conformal channel layer 2200 has a thickness of about 60 Å, and the spacer layer 2220 being formed has a thickness of about 100 Å.

Figure 2F:
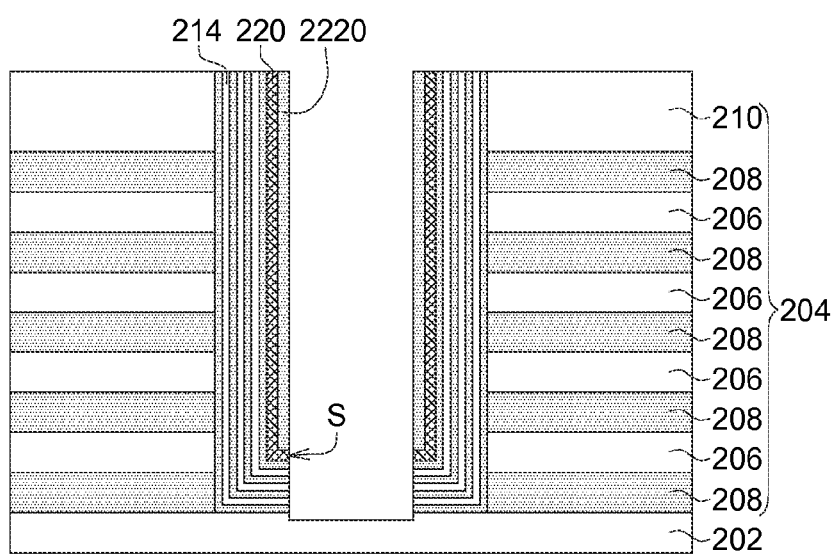
Figure 2G:
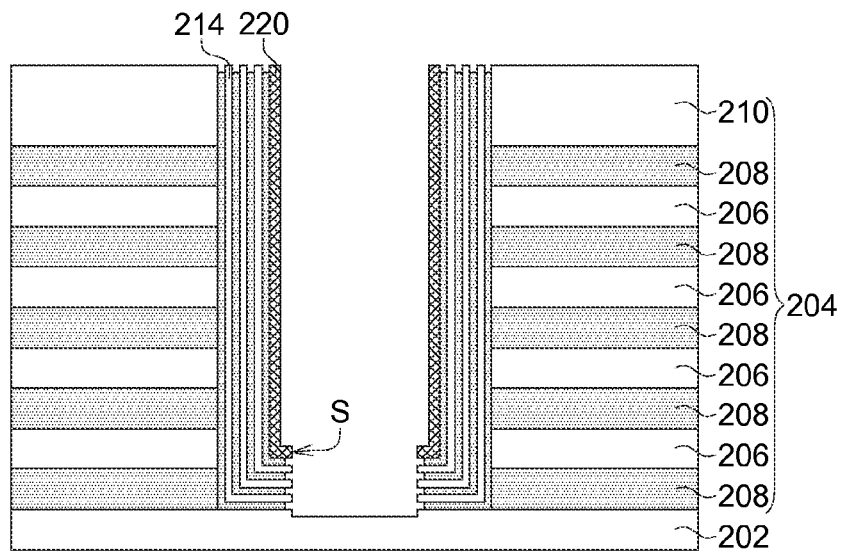

Referring to FIG. 2F, the spacer layer 2220, the conformal channel layer 2200 and the conformal memory layer 2140 are separated. As such, memory layers 214 and channel layers 220 are formed. The memory layers 214 are formed on sidewalls of the stacks 204, respectively. The channel layers 220 are formed on the memory layers 214, respectively. A surface S of each of the channel layers 220 is exposed. The separation process may be conducted by etching, such as dry etching. At this time, parts of the spacer layer 2220 remain on the channel layers 220. Then, the spacer layer 2220 remaining on the channel layers 220 are removed, as shown in FIG. 2G. The removing process may be conducted by a dip process using DHF. In some cases, exposed portions of the oxide layers of the memory layers 214 may also be etched.

Figure 2H:
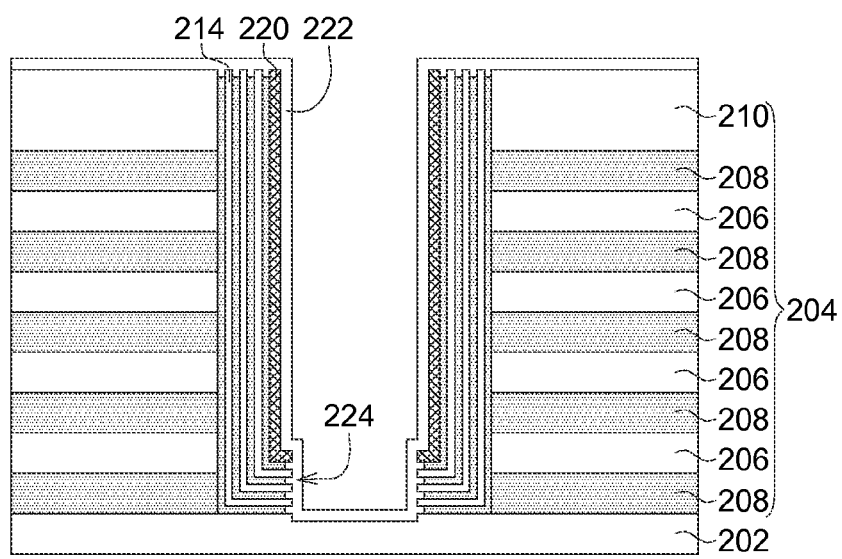

Referring to FIG. 2H, a connecting layer 222 is formed on the channel layers 220, and the connecting layer 222 further extends from the channel layers 220 to the substrate 202. The connecting layer 222 comprises connecting portions 224 connecting the surface S of each of the channel layers 220 to the substrate 202, respectively. The connecting layer 222 may be formed of undoped polysilicon. The connecting layer 222 may be formed by a deposition over the whole structure. In one example, the connecting layer 222 has a thickness of about 70 Å.

Figure 2I:
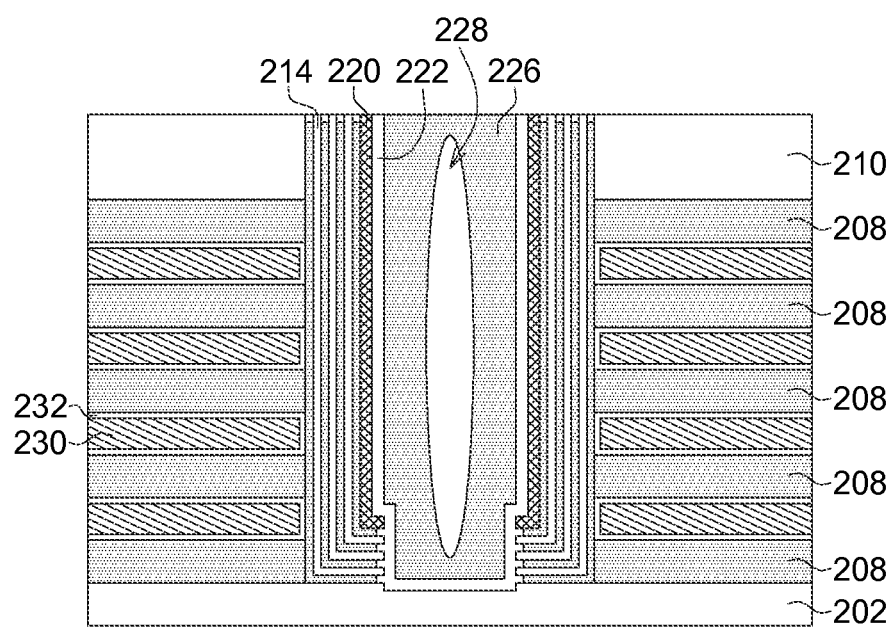

Various processes can be conducted thereafter. In one embodiment, as shown in FIG. 2I, an oxide 226 is filled into the spaces between the stacks 204, wherein an air gap 228 may be formed in the oxide 226. Besides, the portions of connecting layer 222 that are formed on the stacks 204 may be removed by a CMP process relating to the oxide 226. Further, in the embodiment illustrated in FIGS. 2A-2I, the sacrificial layers 206 in the stacks 204 may be replaced by conductive layers 230. The conductive layers 230 may be formed of metal, such as W. In addition, a barrier layer 232 such as formed by TiN may be formed.

The semiconductor structure manufactured by the method according to this embodiment comprises a substrate 202, a plurality of stacks 204, a plurality of memory layers 214, a plurality of channel layers 220 and a connecting layer 222. The stacks 204 are disposed on the substrate 202. Each of the stacks 204 comprises alternately-stacked conductive layers 230 and insulating layers 208. The memory layers 214 are disposed on sidewalls of the stacks 204, respectively. The channel layers 220 are disposed on the memory layers 214, respectively, wherein each of the channel layers 220 comprises a surface S being exposed. The connecting layer 222 is disposed on the channel layers 220, and further extends from the channel layers 220 to the substrate 202. The connecting layer 222 comprises connecting portions 224 connecting the surface S of each of the channel layers 220 to the substrate 202, respectively. For simplicity, other features are not reproduced here.

Figure 3A:
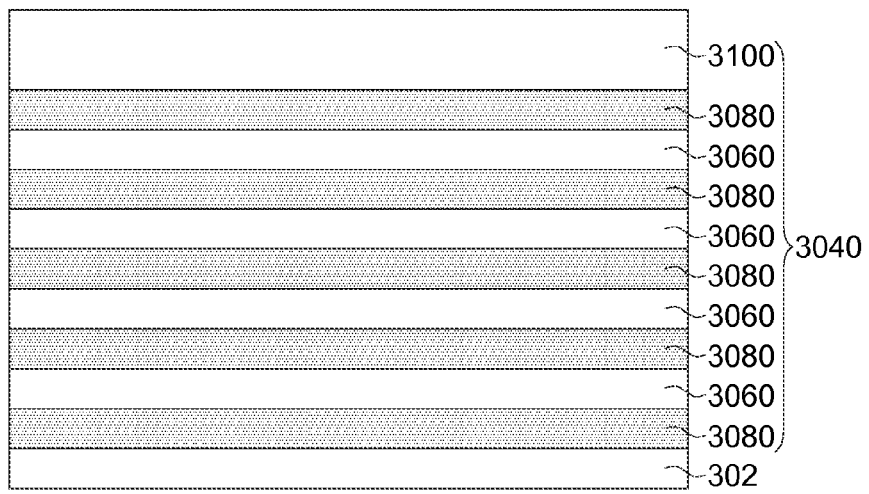
FIGS. 3A-3J illustrate a method for manufacturing a semiconductor structure according to one embodiment.

FIGS. 3A-3J illustrate a method for manufacturing a semiconductor structure according to still another embodiment. Referring to FIG. 3A, a substrate 302 is provided. The substrate 302 may be formed of silicon and be p-type doped. A stack 3040 is formed on the substrate 302. In this embodiment, the stack 3040 comprises a plurality of sacrificial layers 3060 and a plurality of insulating layers 3080 alternately stacked on the substrate 302. The sacrificial layers 3060 may be formed of SiN, and the insulating layers 3080 may be formed of oxide. Optionally, the stack 3040 may further comprise a hard mask layer 3100 formed on the top of the sacrificial layers 3060 and the insulating layers 3080.

Figure 3B:
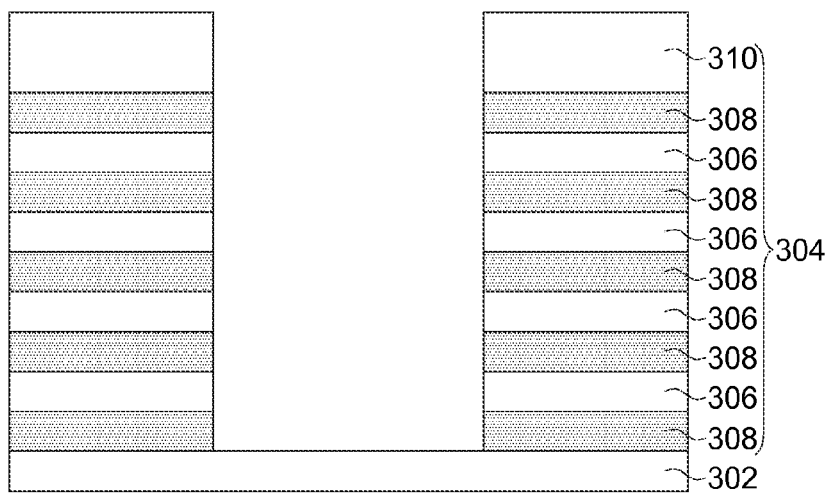
Figure 3C:
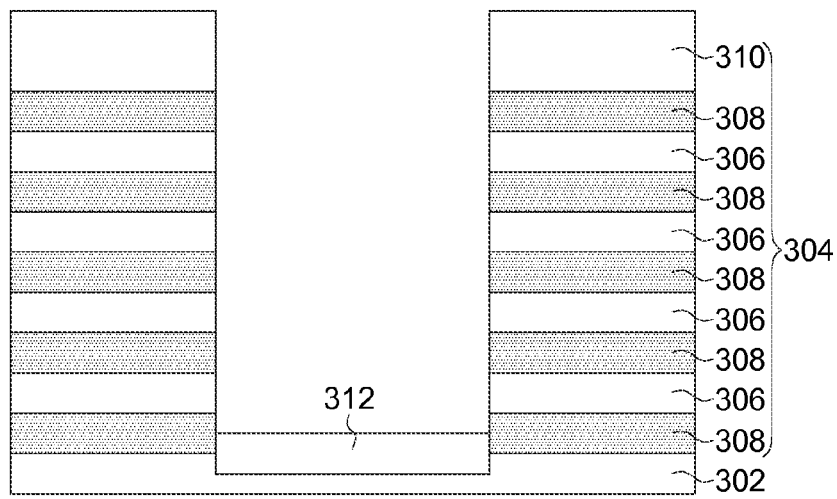

Referring to FIG. 3B, the stack 3040 is patterned. As such, a plurality of stacks 304 are formed on the substrate 302. Each of the stacks 304 comprises alternately-stacked sacrificial layers 306 and insulating layers 308, and an optional hard mask layer 310. In one embodiment, as shown in FIG. 3C, a plurality of SEG layers 312 may be formed on the substrate 302 between the stacks 304. The SEG layers 312 are formed of undoped polysilicon. The SEG layers 312, while may still exist, will not be shown in the following figures.

Figure 3D:
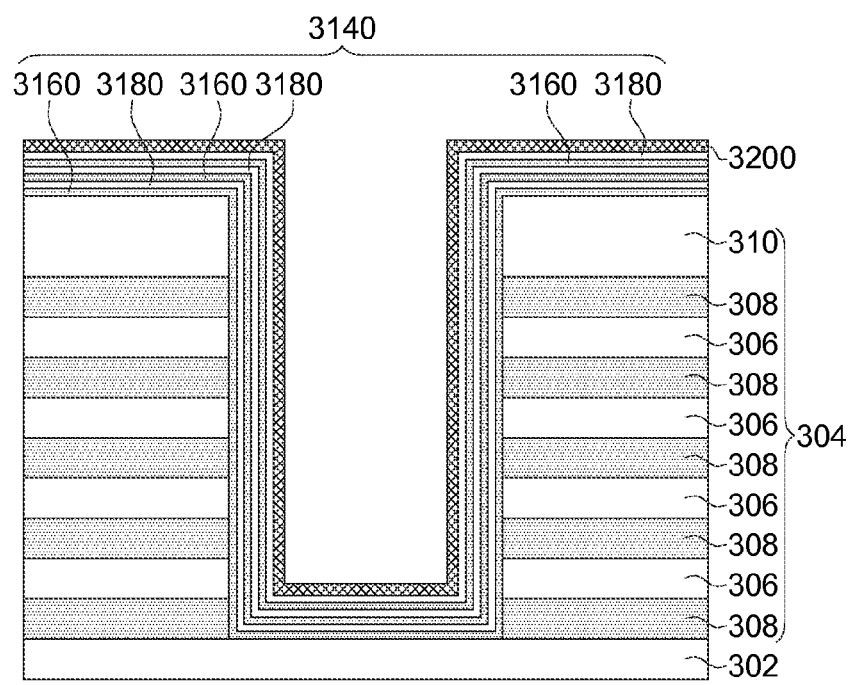

Referring to FIG. 3D, a conformal memory layer 3140 is formed over the stacks 304. The conformal memory layer 3140 may have an nitride-oxide (NO) structure, an nitride-oxide-nitride-oxide (NONO) structure, an nitride-oxide-nitride-oxide-nitride-oxide (NONONO) structure, or the like. In the figures, the NONONO structure comprising oxide layers 3160 and nitride layers 3180 is illustrated. A conformal dummy channel layer 3200 is formed over the conformal memory layer 3140. The conformal dummy channel layer 3200 may be formed of polysilicon. In one example, the conformal dummy channel layer 3200 has a thickness of about 100 Å. The conformal memory layer 3140 and the conformal dummy channel layer 3200 may be formed by deposition.

Figure 3E:
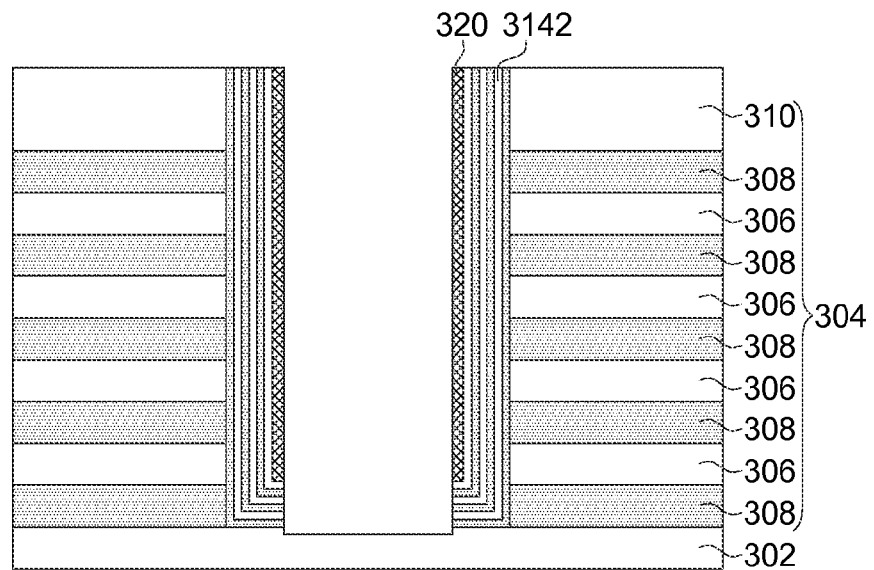
Figure 3F:
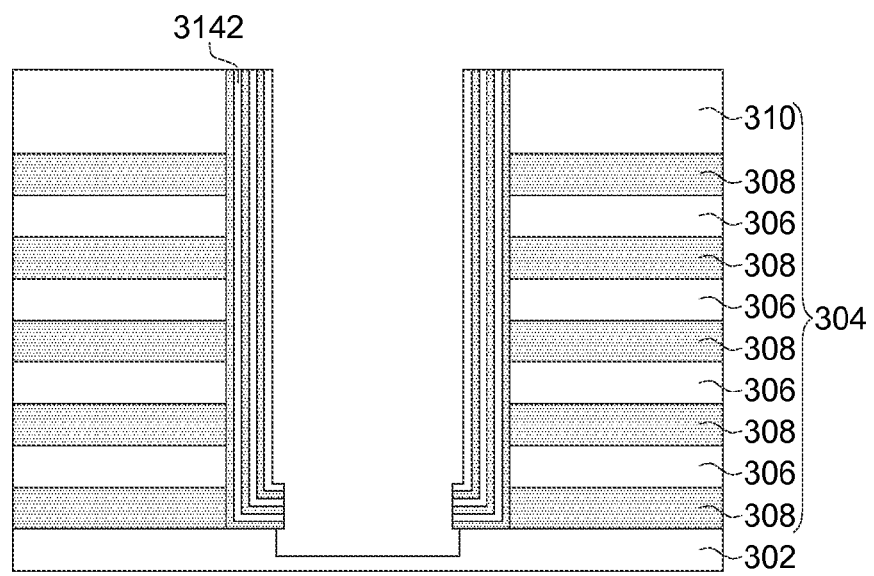

Referring to FIG. 3E, the conformal dummy channel layer 3200 and the conformal memory layer 3140 are separated. As such, a main portion 3142 of each of memory layers and dummy channel layers 320 are formed. The main portions 3142 of the memory layers are formed on sidewalls of the stacks 304, respectively. The dummy channel layers 320 are formed on the main portion 3142 of each of the memory layers, respectively. The separation process may be conducted by etching, such as dry etching. Then, as shown in FIG. 3F, the dummy channel layers 320 are removed, and the outer nitride layers of the main portions 3142 of the memory layers are exposed. The removing process may be conducted by etching using dilute $NH_4OH$. In some cases, the silicon substrate 302 may also be etched. However, the main portions 3142 of the memory layers will keep intact.

Figure 3G:
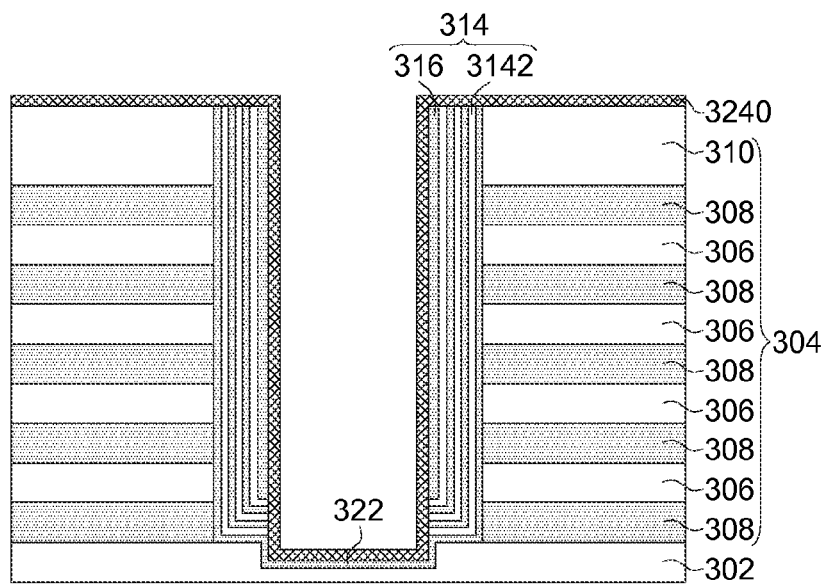

Referring to FIG. 3G, a remaining portion 316 of each of the memory layers 314 are formed. In one embodiment, a memory layer 314 being formed comprises a blocking layer, a trapping layer and a tunneling layer. According to one embodiment, the remaining portions 316 (an oxide layer) of the memory layers 314 may be formed by in-situ steam generated (ISSG) oxidation of the outer nitride layers of main portions 3142 of the memory layers. Concurrently, an oxide 322 may be formed on the exposed portions of the substrate 302. In one example, the oxide layer of the memory layers 314 formed by this ISSG oxidation process has a thickness of about 10 Å to about 13 Å, and the oxide 322 has a thickness of about 30 Å. In one embodiment, before the ISSG oxidation process, a dip process using DHF may be optionally conducted to remove naturally growing oxide. In this embodiment, since the outer oxide layer of the memory layer is formed by an additional process after an etching process, even though the oxide layer is very thin such as only about 10 Å to about 20 Å (an oxide layer of a typical memory layer is about, for example, 50 Å), it will not be damaged by the etching process.

A conformal channel layer 3240 is formed over the stacks 304 and the memory layers 314. The conformal channel layer 3240 may be formed of undoped polysilicon. The conformal channel layer 3240 may be formed by deposition. In one example, the conformal channel layer 3240 has a thickness of about 80 Å.

Figure 3H:
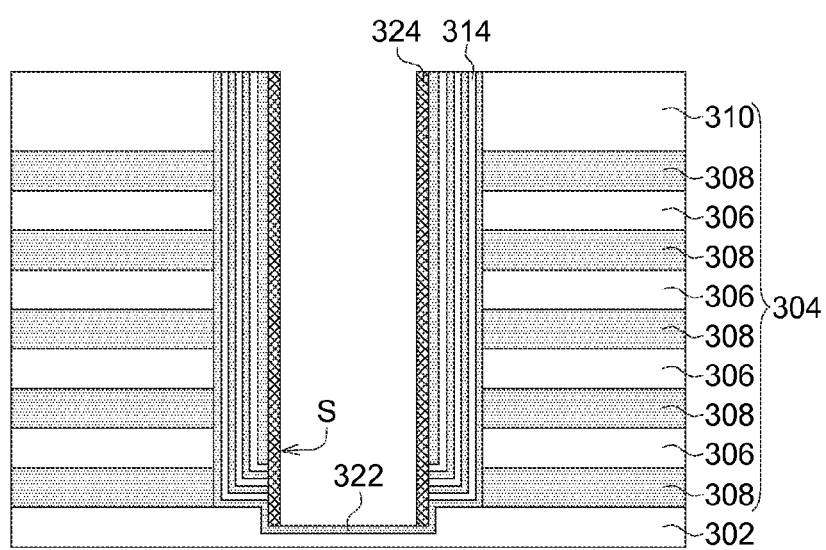

Referring to FIG. 3H, the conformal channel layer 3240 is separated. As such, a plurality of channel layers 324 are formed. The channel layers 324 are formed on the memory layers 314, respectively. A surface S of each of the channel layers 324 is exposed. The separation process may be conducted by etching. In this etching process, the channel layers 324 almost or completely keep intact. That is, the method according to this embodiment has the advantage relating the completeness of the channel layers.

Figure 3I:
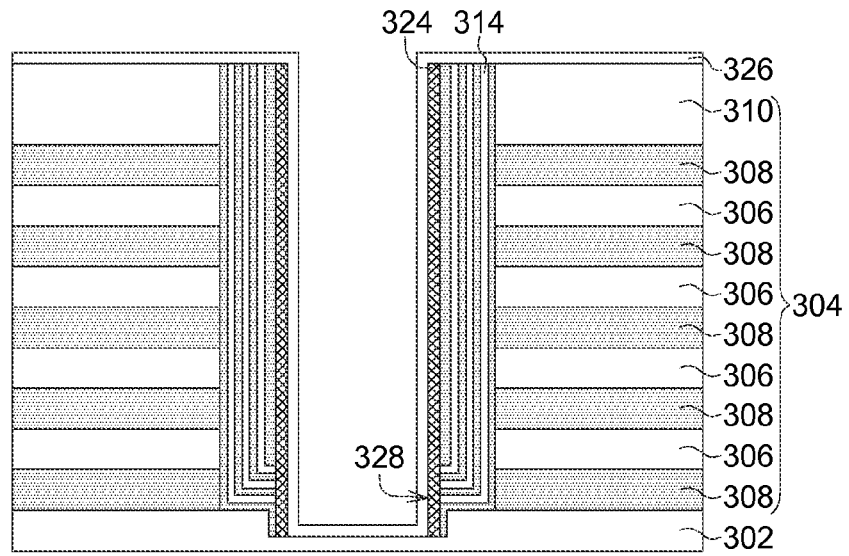

Referring to FIG. 3I, the oxide 322 is removed by, for example, a dip process using DHF. Then, a connecting layer 326 is formed on the channel layers 324, and the connecting layer 326 further extends from the channel layers 324 to the substrate 302. The connecting layer 326 comprises connecting portions 328 connecting the surface S of each of the channel layers 324 to the substrate 302, respectively. The connecting layer 326 may be formed of undoped polysilicon. The connecting layer 326 may be formed by a deposition over the whole structure.

Figure 3J:
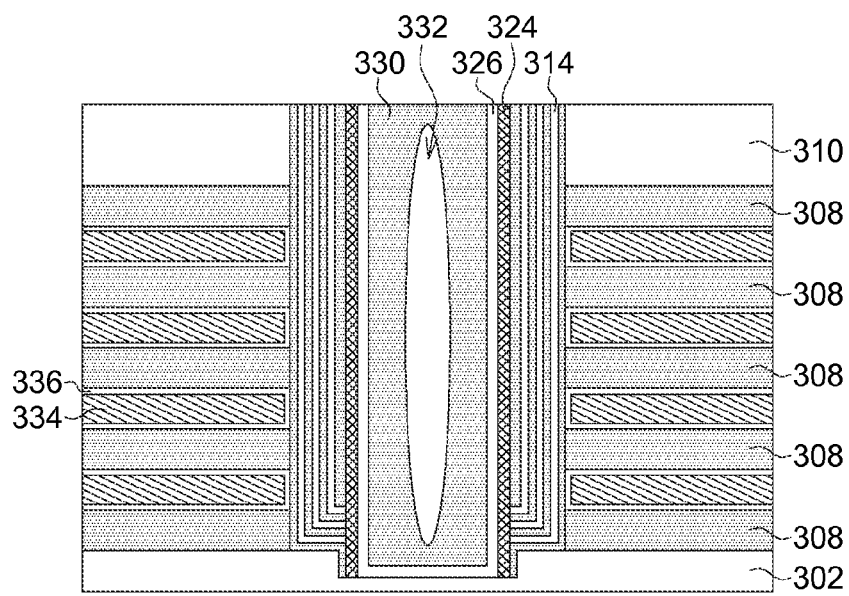

Various processes can be conducted thereafter. In one embodiment, as shown in FIG. 3J, an oxide 330 is filled into the spaces between the stacks 304, wherein an air gap 332 may be formed in the oxide 330. Besides, the portions of connecting layer 326 that are formed on the stacks 304 may be removed by a CMP process relating to the oxide 330. Further, in the embodiment illustrated in FIGS. 3A-3J, the sacrificial layers 306 in the stacks 304 may be replaced by conductive layers 334. The conductive layers 334 may be formed of metal, such as W. In addition, a barrier layer 336 such as formed by TiN may be formed.

The semiconductor structure manufactured by the method according to this embodiment comprises a substrate 302, a plurality of stacks 304, a plurality of memory layers 314, a plurality of channel layers 324 and a connecting layer 326. The stacks 304 are disposed on the substrate 302. Each of the stacks 304 comprises alternately-stacked conductive layers 334 and insulating layers 308. The memory layers 314 are disposed on sidewalls of the stacks 304, respectively. The channel layers 324 are disposed on the memory layers 314, respectively, wherein each of the channel layers 324 comprises a surface S being exposed. The connecting layer 326 is disposed on the channel layers 324, and further extends from the channel layers 324 to the substrate 302. The connecting layer 326 comprises connecting portions 328 connecting the surface S of each of the channel layers 324 to the substrate 302, respectively. For simplicity, other features are not reproduced here.

Figure 4A:
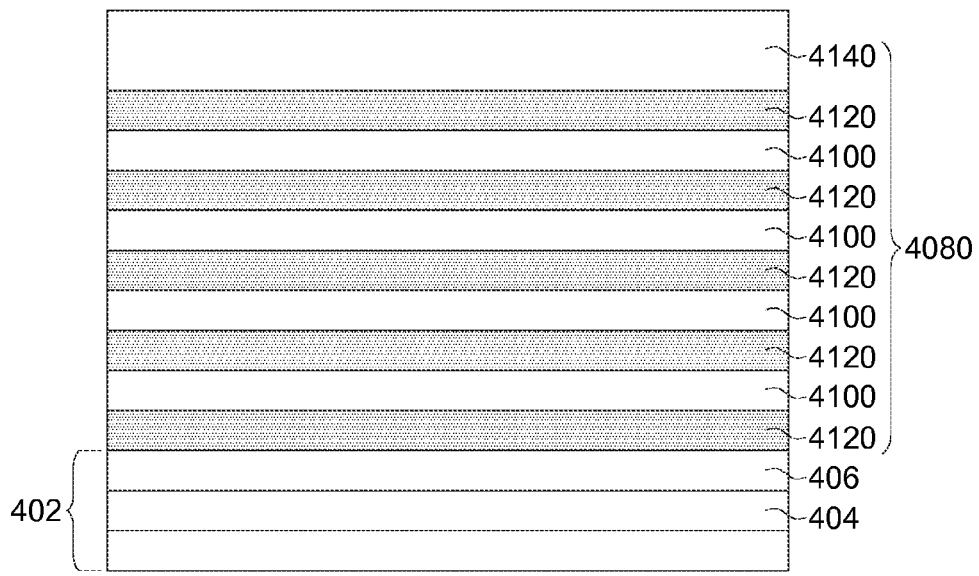
FIGS. 4A-4F illustrate a method for manufacturing a semiconductor structure according to one embodiment.

FIGS. 4A-4F illustrate a method for manufacturing a semiconductor structure according to yet another embodiment. Referring to FIG. 4A, a substrate 402 is provided. In this embodiment, the substrate 402 comprises a buried layer 404 and a source line 406 formed on the buried layer 404. The buried layer 404 may be a buried oxide layer. The source line 406 may be n-type heavily doped. A stack 4080 is formed on the substrate 402. In this embodiment, the stack 4080 comprises a plurality of conductive layers 4100 and a plurality of insulating layers 4120 alternately stacked on the substrate 402. The conductive layers 4100 may be formed of p-type heavily doped polysilicon, and the insulating layers 4120 may be formed of oxide. Optionally, the stack 4080 may further comprise a hard mask layer 4140 formed on the top of the conductive layers 4100 and the insulating layers 4120. The hard mask layer 4140 may be formed of SiN.

Figure 4B:
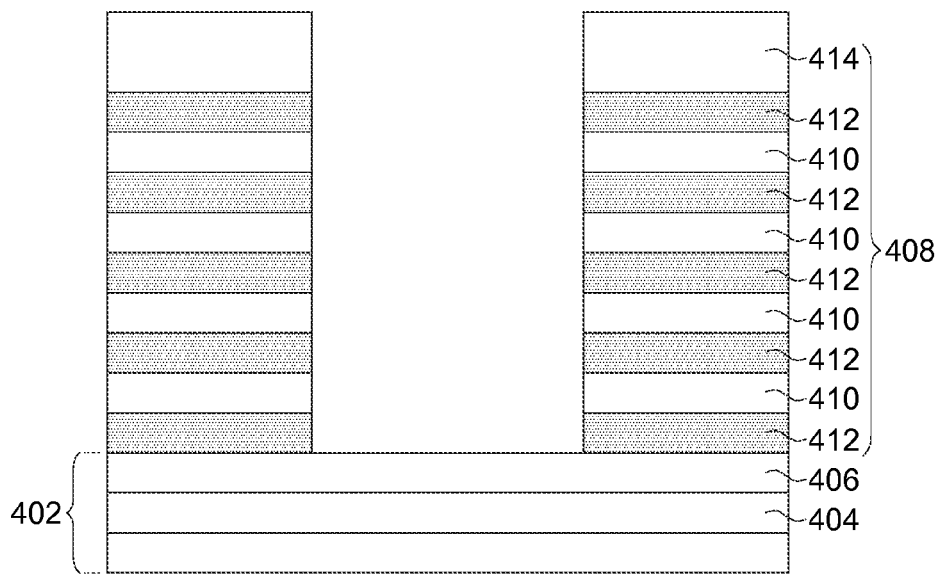

Referring to FIG. 4B, the stack 4080 is patterned. As such, a plurality of stacks 408 are formed on the substrate 402. Each of the stacks 408 comprises alternately-stacked conductive layers 410 and insulating layers 412, and an optional hard mask layer 414.

Figure 4C:
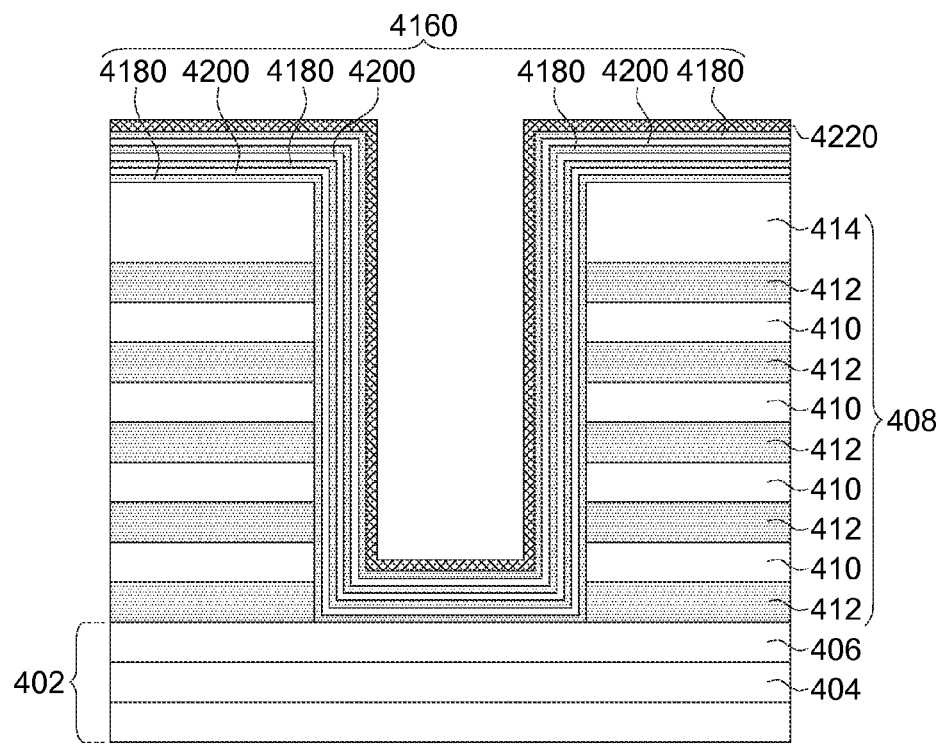

Referring to FIG. 4C, a conformal memory layer 4160 is formed over the stacks 408. In one embodiment, the conformal memory layer 4160 comprises a blocking layer, a trapping layer and a tunneling layer. The conformal memory layer 4160 may have an ONO structure, an ONONO structure, an ONONONO structure, or the like. In the figures, the ONONONO structure comprising oxide layers 4180 and nitride layers 4200 is illustrated. A conformal channel layer 4220 is formed over the conformal memory layer 4160. The conformal channel layer 4220 may be formed of polysilicon. In one example, the conformal channel layer 4220 has a thickness of about 150 Å. The conformal memory layer 4160 and the conformal channel layer 4220 may be formed by deposition.

Figure 4D:
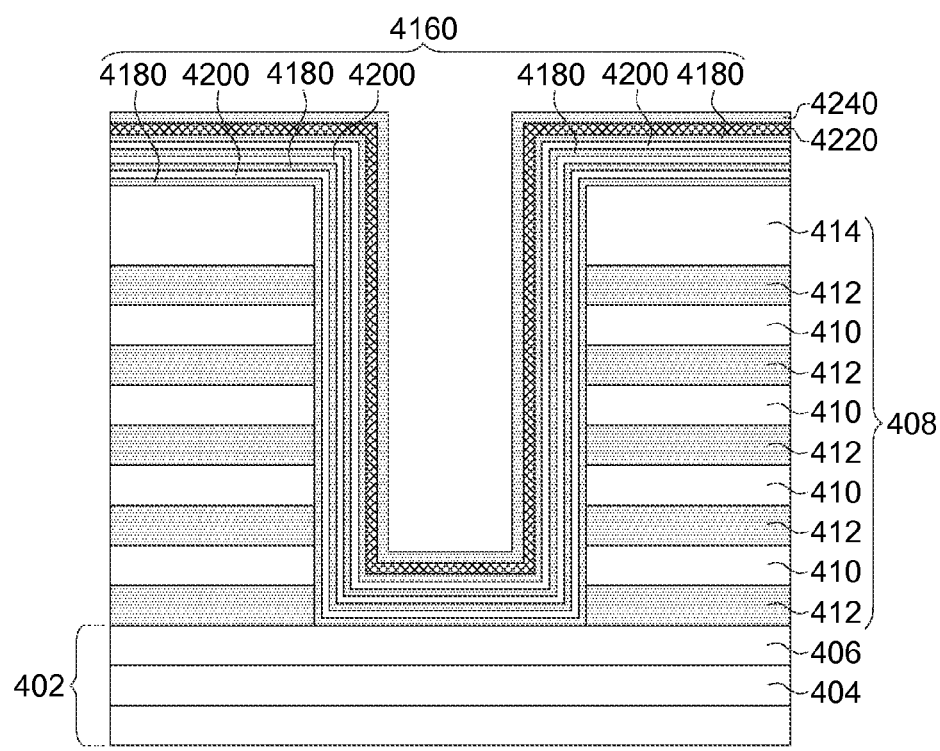

Referring to FIG. 4D, a spacer layer 4240 is formed on the conformal channel layer 4220. According to one embodiment, the spacer layer 4240 may be formed by oxidizing the conformal channel layer 4220. In one example, after the oxidation process, the remaining conformal channel layer 4220 has a thickness of about 100 Å, and the spacer layer 4240 being formed has a thickness of about 110 Å. The oxide layer can protect the polysilicon layer thereunder.

Figure 4E:
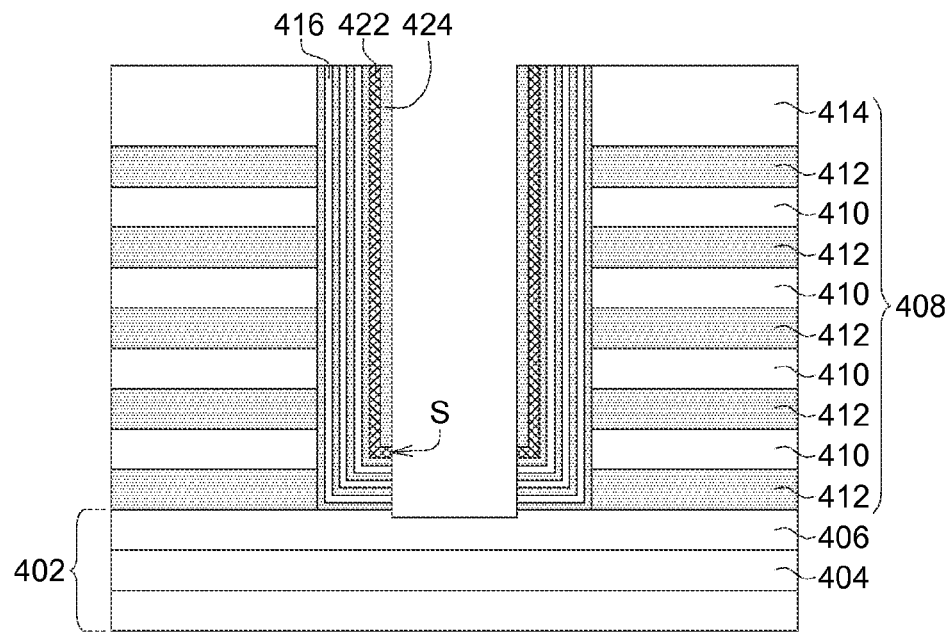

Referring to FIG. 4E, the spacer layer 4240, the conformal channel layer 4220 and the conformal memory layer 4160 are separated. As such, memory layers 416, channel layers 422 and spacers 424 are formed. The memory layers 416 are formed on sidewalls of the stacks 408, respectively. The channel layers 422 are formed on the memory layers 416, respectively. At this time, a surface S of each of the channel layers 422 is exposed. The spacers 424 are formed on the channel layers 422, respectively. The separation process may be conducted by etching, such as dry etching.

Figure 4F:
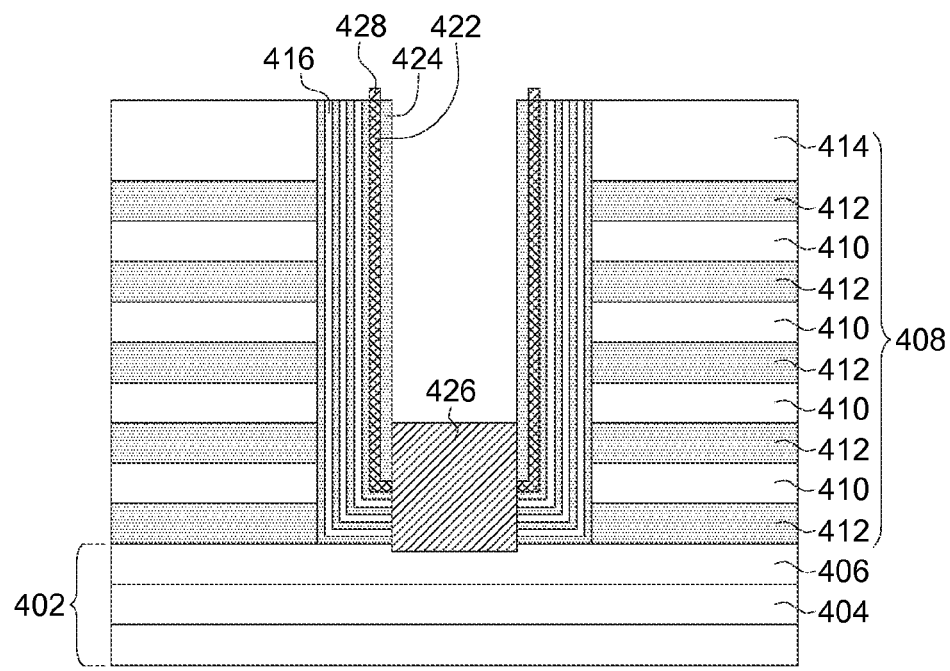

Referring to FIG. 4F, a SEG process is conducted, and thereby a plurality of connecting portions 426 are formed. The connecting portions 426 connect the surface S of each of the channel layers 422 to the substrate 402, respectively. More specifically, the connecting portions 426 are connected to the source line 406. The connecting portions 426 are SEG layers formed of n-type heavily doped silicon growing from the n-type heavily doped source line 406. Concurrently, SEG layers 428 may be formed on the polysilicon channel layers 422. The SEG layers 428 can be removed in the following steps. In one embodiment, before the SEG process, a dip process using DHF may be optionally conducted to remove naturally growing oxide. However, the spacers 424 formed of oxide should keep intact.

The semiconductor structure manufactured by the method according to this embodiment comprises a substrate 402, a plurality of stacks 408, a plurality of memory layers 416, a plurality of channel layers 422 and a plurality of connecting portions 426. The substrate 402 may comprise a buried layer 404 and a source line 406 formed on the buried layer 404. The stacks 408 are disposed on the substrate 402. Each of the stacks 408 comprises alternately-stacked conductive layers 410 and insulating layers 412. The memory layers 416 are disposed on sidewalls of the stacks 408, respectively. The channel layers 422 are disposed on the memory layers 416, respectively, wherein each of the channel layers 422 comprises a surface S being exposed. In one embodiment, the semiconductor structure may further comprise a plurality of spacers 424 disposed on the channel layers 422, respectively. The connecting portions 426 connect the surface S of each of the channel layers 422 to the substrate 402, respectively. More specifically, the connecting portions 426 connect the surface S of each of the channel layers 422 to the source line 406, respectively. In this embodiment, the connecting portions 426 are SEG layers. The connecting portions 426 may be n-type heavily doped. For simplicity, other features are not reproduced here.

Figure 5A:
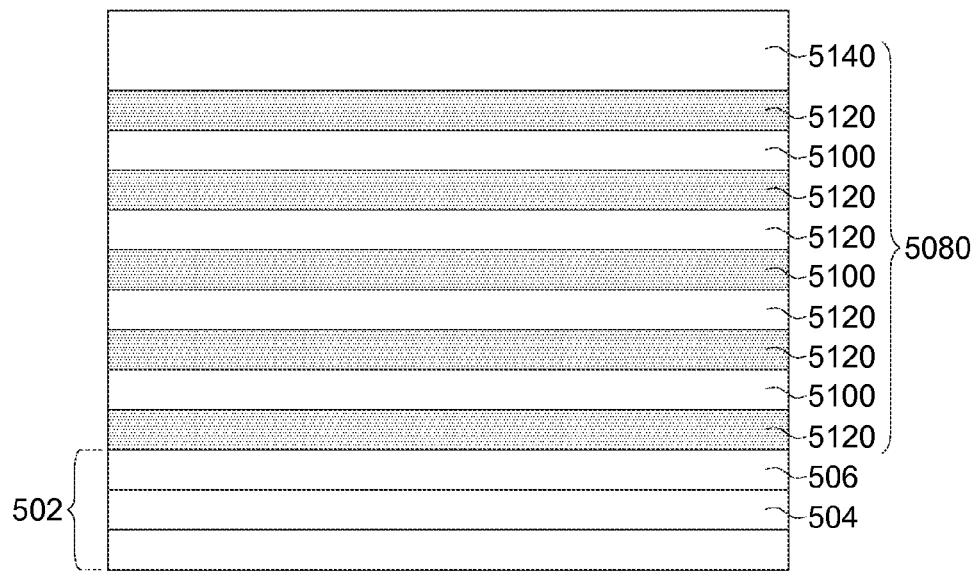
FIGS. 5A-5H illustrate a method for manufacturing a semiconductor structure according to one embodiment.

FIGS. 5A-5H illustrate a method for manufacturing a semiconductor structure according to a further embodiment. Referring to FIG. 5A, a substrate 502 is provided. In this embodiment, the substrate 502 comprises a buried layer 504 and a source line 506 formed on the buried layer 504. The buried layer 504 may be a buried oxide layer. The source line 506 may be n-type heavily doped. A stack 5080 is formed on the substrate 502. In this embodiment, the stack 5080 comprises a plurality of conductive layers 5100 and a plurality of insulating layers 5120 alternately stacked on the substrate 502. The conductive layers 5100 may be formed of p-type heavily doped polysilicon, and the insulating layers 5120 may be formed of oxide. Optionally, the stack 5080 may further comprise a hard mask layer 5140 formed on the top of the conductive layers 5100 and the insulating layers 5120.

Figure 5B:
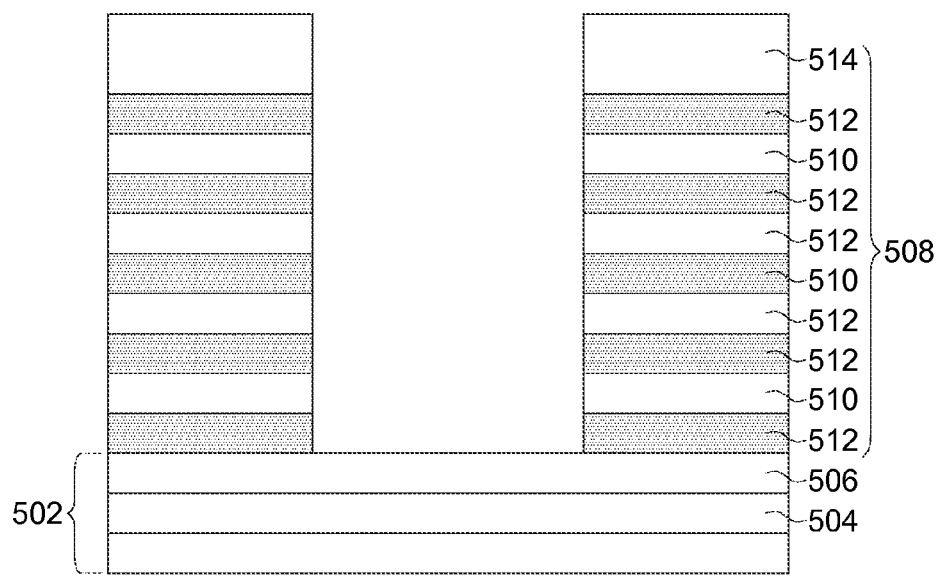

Referring to FIG. 5B, the stack 5080 is patterned. As such, a plurality of stacks 508 are formed on the substrate 502. Each of the stacks 508 comprises alternately-stacked conductive layers 510 and insulating layers 512, and an optional hard mask layer 514.

Figure 5C:
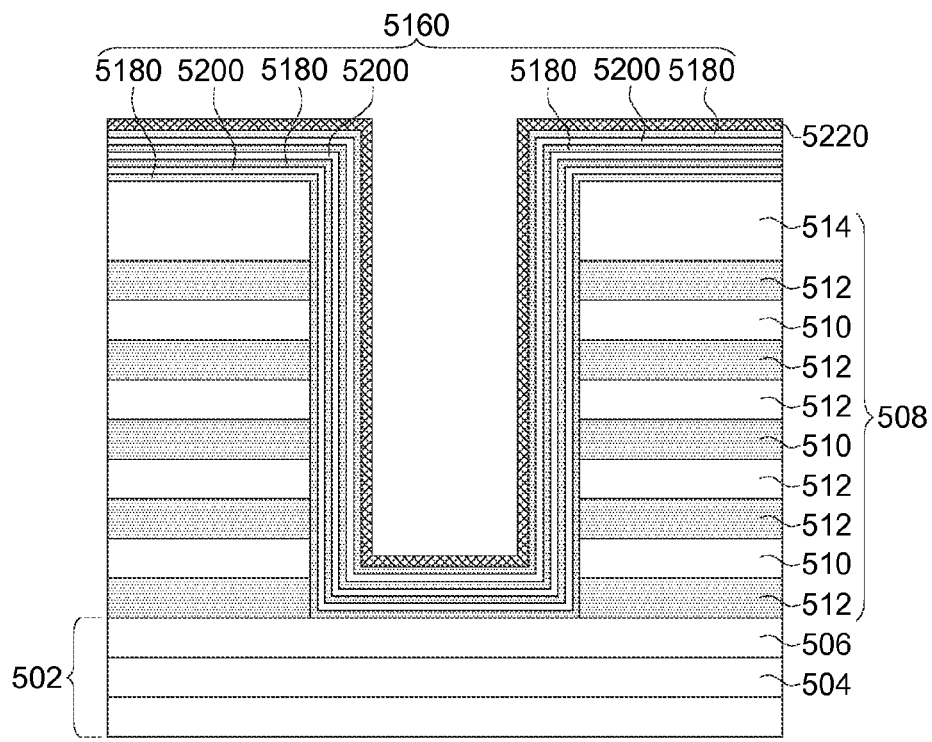

Referring to FIG. 5C, a conformal memory layer 5160 is formed over the stacks 508. In one embodiment, the conformal memory layer 5160 comprises a blocking layer, a trapping layer and a tunneling layer. The conformal memory layer 5160 may have an ONO structure, an ONONO structure, an ONONONO structure, or the like. In the figures, the ONONONO structure comprising oxide layers 5180 and nitride layers 5200 is illustrated. A conformal channel layer 5220 is formed over the conformal memory layer 5160. The conformal channel layer 5220 may be formed of polysilicon. Since another polysilicon layer will be formed in the following steps of this embodiment, the thickness of the conformal channel layer 5220 may be thinner than the thickness of the conformal channel layer 4220. In one example, the conformal channel layer 5220 has a thickness of about 100 Å. The conformal memory layer 5160 and the conformal channel layer 5220 may be formed by deposition.

Figure 5D:
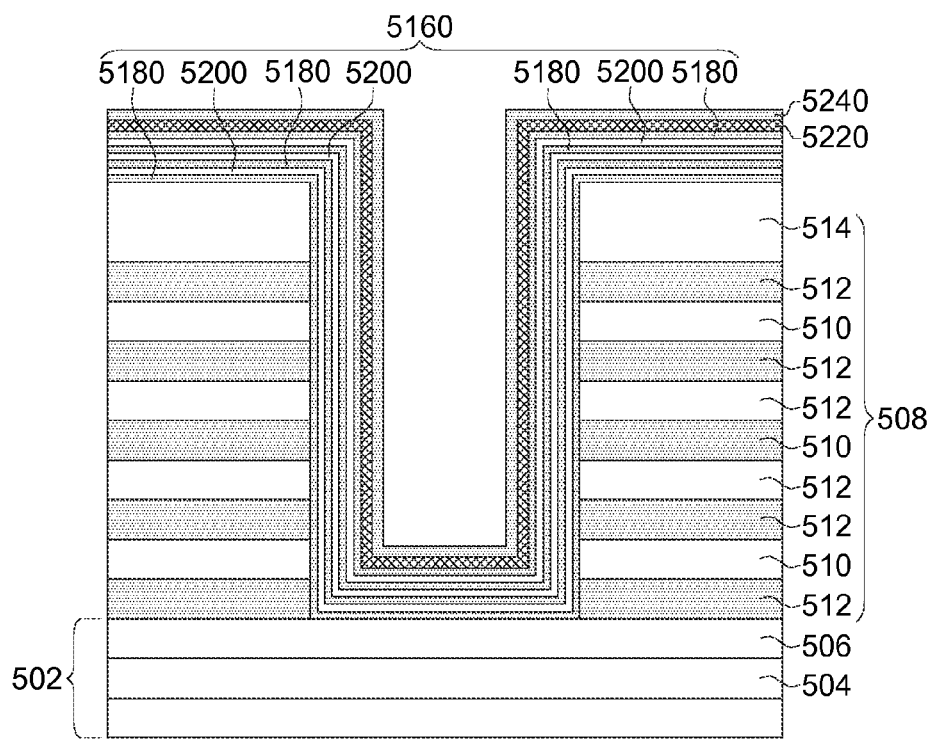

Referring to FIG. 5D, a spacer layer 5240 is formed on the conformal channel layer 5220. According to one embodiment, the spacer layer 5240 may be formed by oxidizing the conformal channel layer 5220. In one example, after the oxidation process, the remaining conformal channel layer 5220 has a thickness of about 60 Å, and the spacer layer 5240 being formed has a thickness of about 100 Å.

Figure 5E:
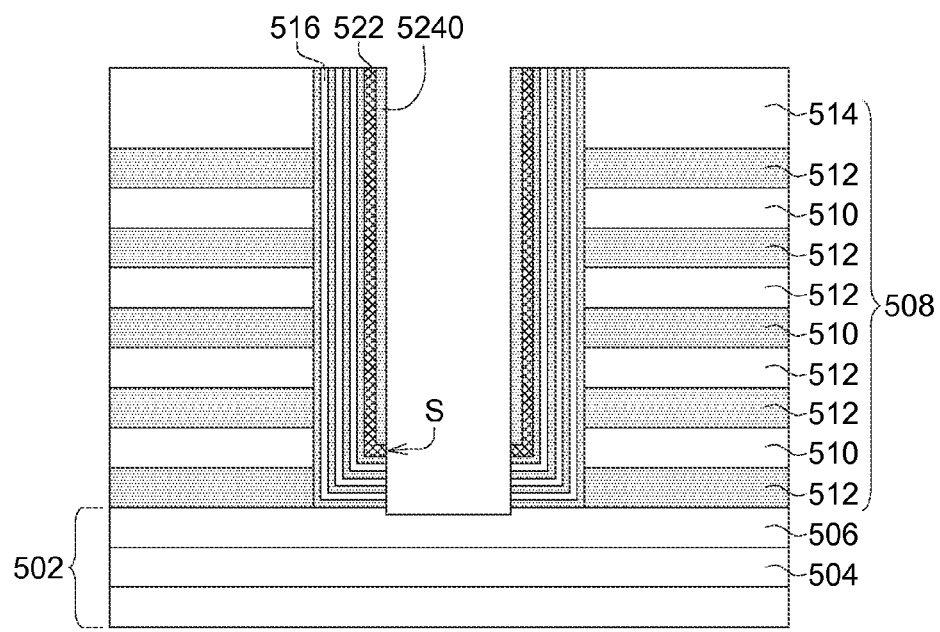
Figure 5F:
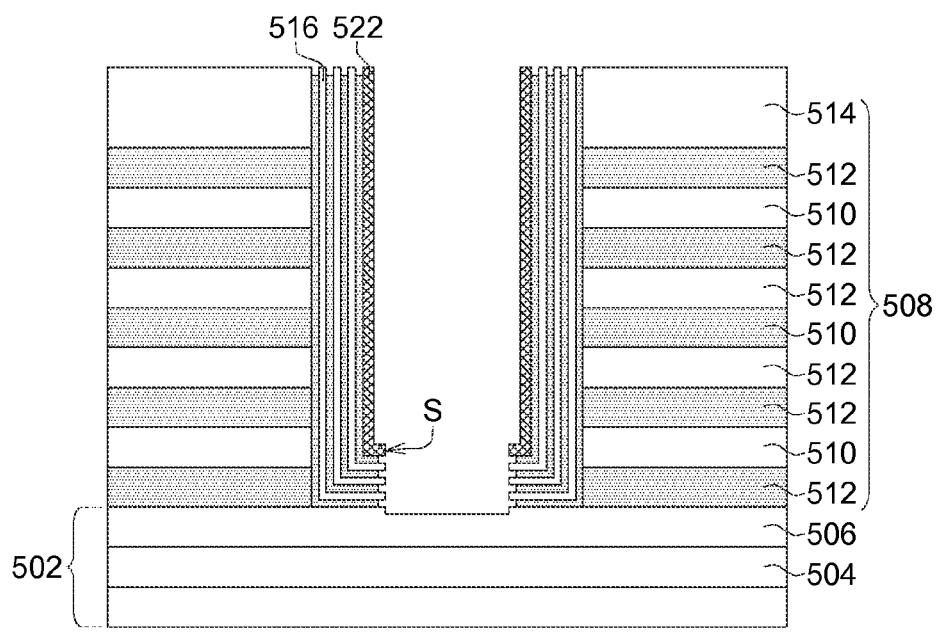

Referring to FIG. 5E, the spacer layer 5240, the conformal channel layer 5220 and the conformal memory layer 5160 are separated. As such, memory layers 516 and channel layers 522 are formed. The memory layers 516 are formed on sidewalls of the stacks 508, respectively. The channel layers 522 are formed on the memory layers 516, respectively. A surface S of each of the channel layers 522 is exposed. The separation process may be conducted by etching, such as dry etching. At this time, parts of the spacer layer 5240 remain on the channel layers 522. Then, the spacer layer 5240 remaining on the channel layers 522 are removed, as shown in FIG. 5F. The removing process may be conducted by a dip process using DHF. In some cases, exposed portions of the oxide layers of the memory layers 516 may also be etched.

Figure 5G:
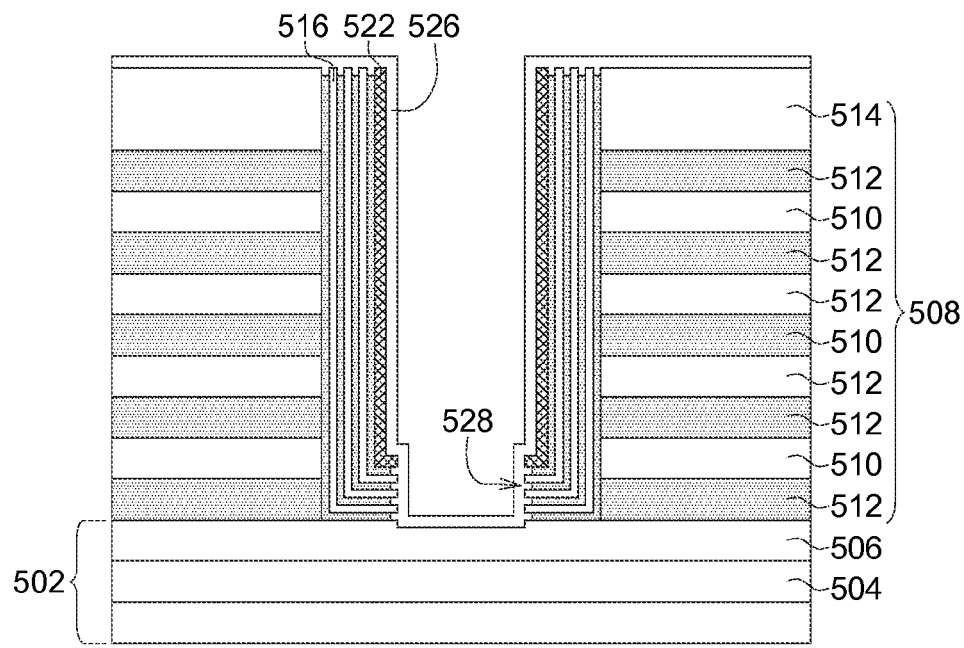

Referring to FIG. 5G, a connecting layer 526 is formed on the channel layers 522, and the connecting layer 526 further extends from the channel layers 522 to the substrate 502. The connecting layer 526 comprises connecting portions 528 connecting the surface S of each of the channel layers 522 to the substrate 502, respectively. More specifically, the connecting portions 528 are connected to the source line 506. The connecting layer 526 may be formed of undoped polysilicon. The connecting layer 526 may be formed by a deposition over the whole structure. In one example, the connecting layer 526 has a thickness of about 70 Å.

Figure 5H:
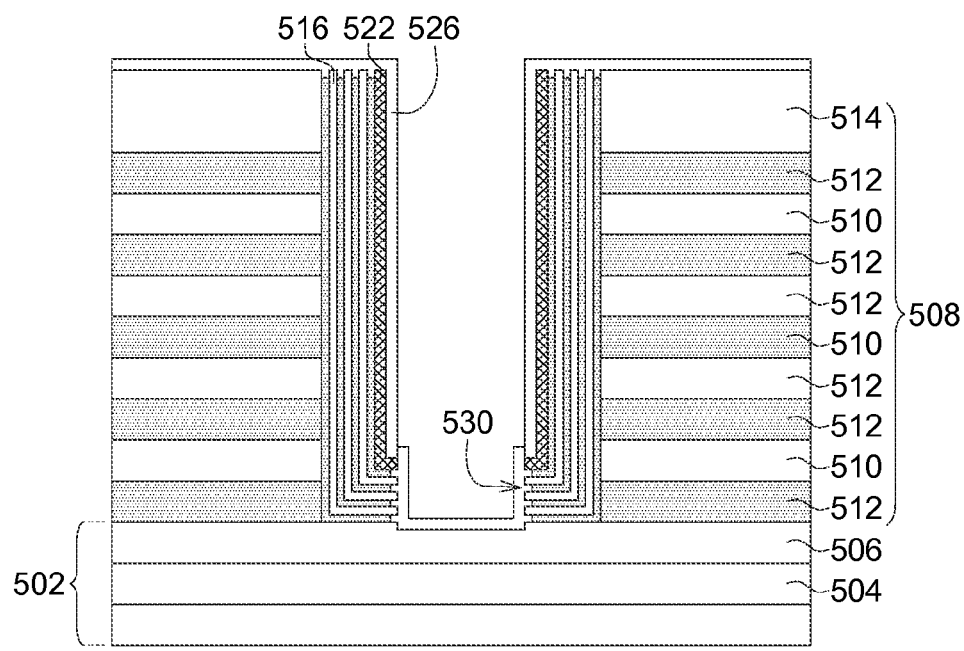

Referring to FIG. 5H, the connecting portions 528 may be transformed to be n-type heavily doped. According to one embodiment, the doped connecting portions 530 may be formed by rapid thermal treating. By this process, dopants are diffused from the n-type heavily doped source line 506 toward the channel layers 522. In an alternate embodiment, implantation may be conducted.

The semiconductor structure manufactured by the method according to this embodiment comprises a substrate 502, a plurality of stacks 508, a plurality of memory layers 516, a plurality of channel layers 522 and a connecting layer 526. The substrate 502 may comprise a buried layer 504 and a source line 506 formed on the buried layer 504. The stacks 508 are disposed on the substrate 502. Each of the stacks 508 comprises alternately-stacked conductive layers 510 and insulating layers 512. The memory layers 516 are disposed on sidewalls of the stacks 508, respectively. The channel layers 522 are disposed on the memory layers 516, respectively, wherein each of the channel layers 522 comprises a surface S being exposed. The connecting layer 526 is disposed on the channel layers 522, and further extends from the channel layers 522 to the substrate 502. The connecting layer 526 comprises connecting portions 530 connecting the surface S of each of the channel layers 522 to the substrate 502, respectively. More specifically, the connecting portions 530 connect the surface S of each of the channel layers 522 to the source line 506, respectively. The connecting portions 530 may be n-type heavily doped. For simplicity, other features are not reproduced here.

Figure 6A:
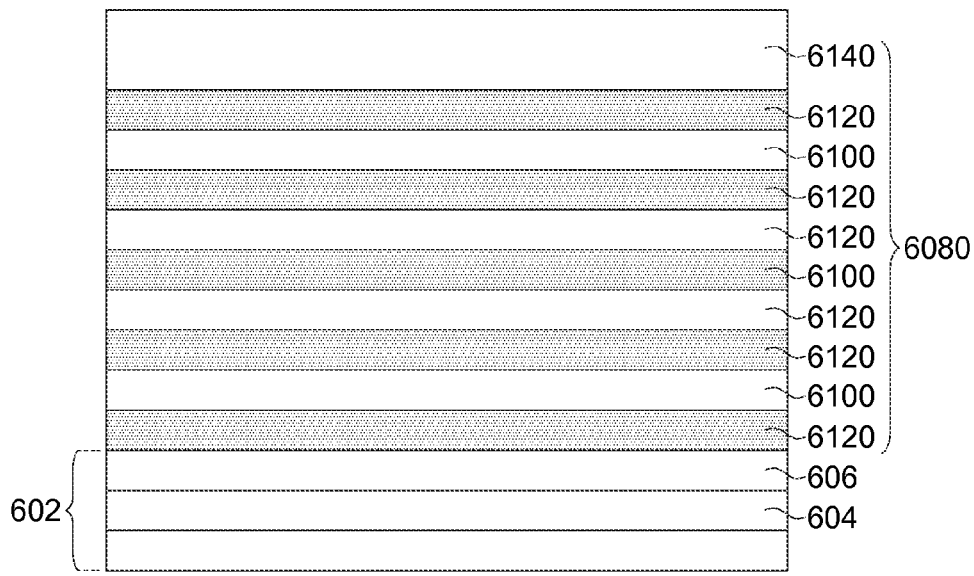
FIGS. 6A-6I illustrate a method for manufacturing a semiconductor structure according to one embodiment.

FIGS. 6A-6I illustrate a method for manufacturing a semiconductor structure according to a still further embodiment. Referring to FIG. 6A, a substrate 602 is provided. In this embodiment, the substrate 602 comprises a buried layer 604 and a source line 606 formed on the buried layer 604. The buried layer 604 may be a buried oxide layer. The source line 606 may be n-type heavily doped. A stack 6080 is formed on the substrate 602. In this embodiment, the stack 6080 comprises a plurality of conductive layers 6100 and a plurality of insulating layers 6120 alternately stacked on the substrate 602. The conductive layers 6100 may be formed of p-type heavily doped polysilicon, and the insulating layers 6120 may be formed of oxide. Optionally, the stack 6080 may further comprise a hard mask layer 6140 formed on the top of the conductive layers 6100 and the insulating layers 6120.

Figure 6B:
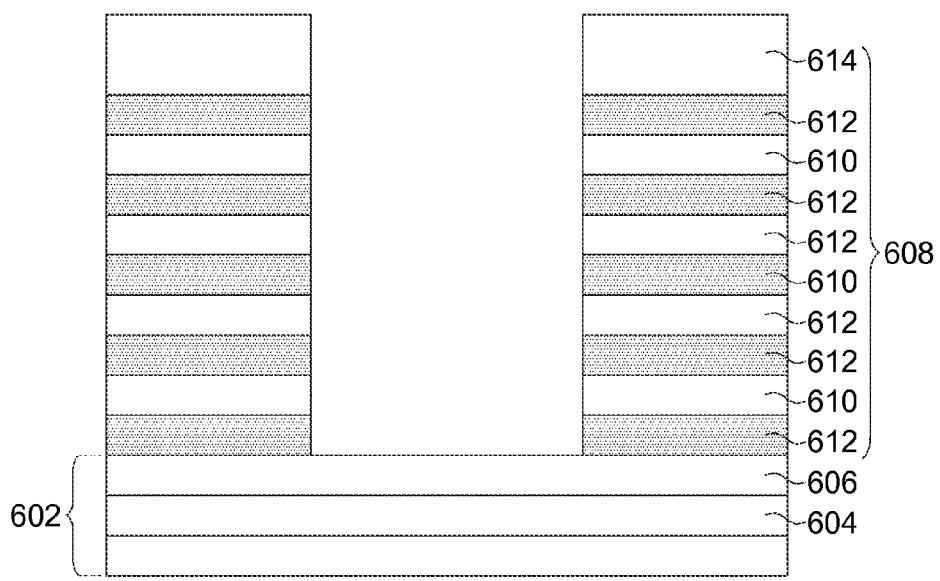

Referring to FIG. 6B, the stack 6080 is patterned. As such, a plurality of stacks 608 are formed on the substrate 602. Each of the stacks 608 comprises alternately-stacked conductive layers 610 and insulating layers 612, and an optional hard mask layer 614.

Figure 6C:
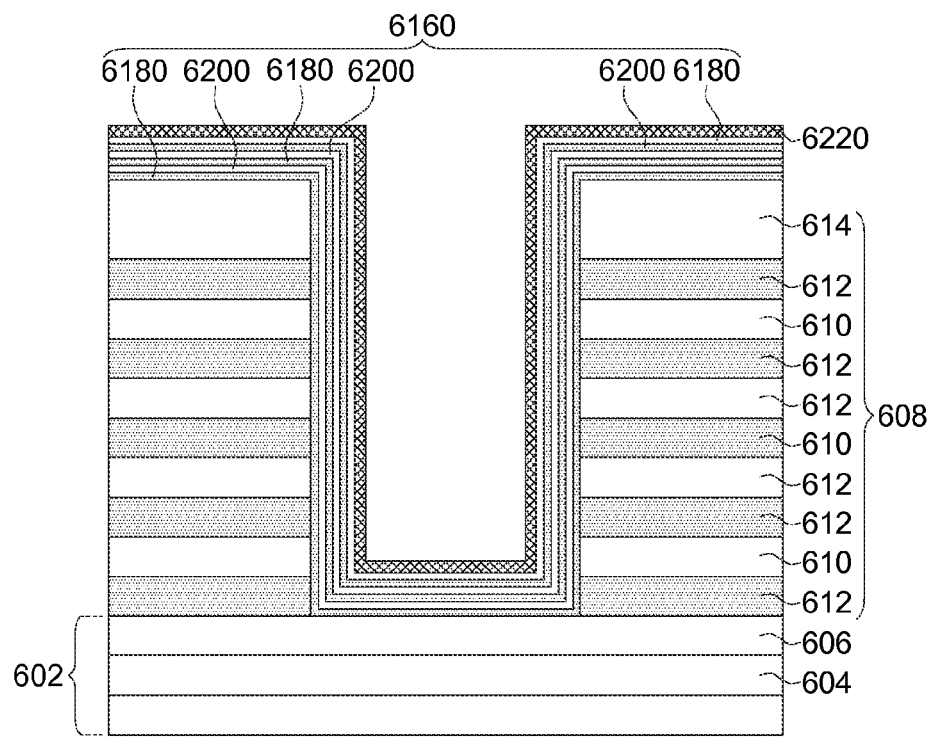

Referring to FIG. 6C, a conformal memory layer 6160 is formed over the stacks 608. The conformal memory layer 6160 may have an nitride-oxide (NO) structure, an nitride-oxide-nitride-oxide (NONO) structure, an nitride-oxide-nitride-oxide-nitride-oxide (NONONO) structure, or the like. In the figures, the NONONO structure comprising oxide layers 6180 and nitride layers 6200 is illustrated. A conformal dummy channel layer 6220 is formed over the conformal memory layer 6160. The conformal dummy channel layer 6220 may be formed of polysilicon. In one example, the conformal dummy channel layer 6220 has a thickness of about 100 Å. The conformal memory layer 6160 and the conformal dummy channel layer 6220 may be formed by deposition.

Figure 6D:
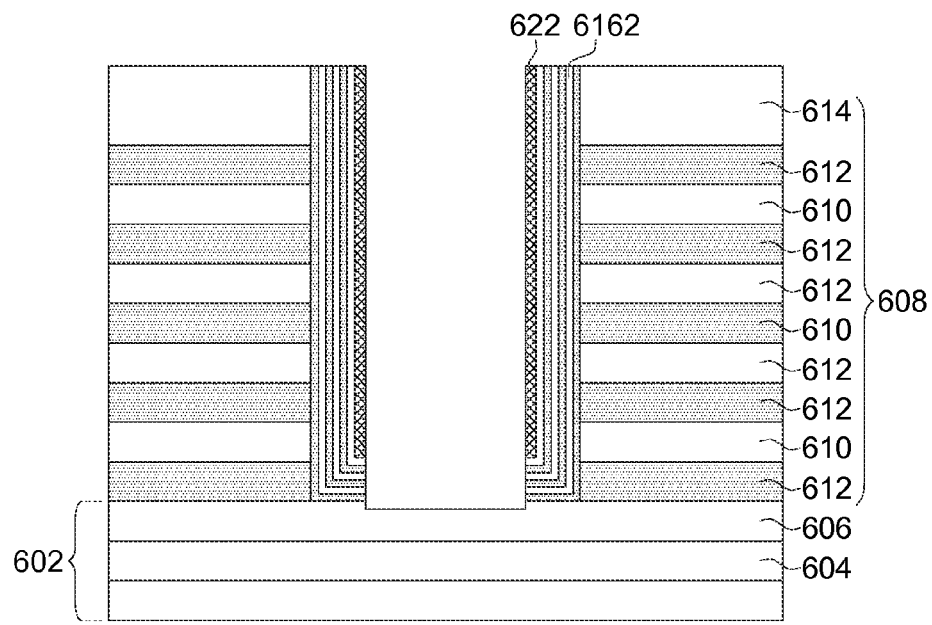
Figure 6E:
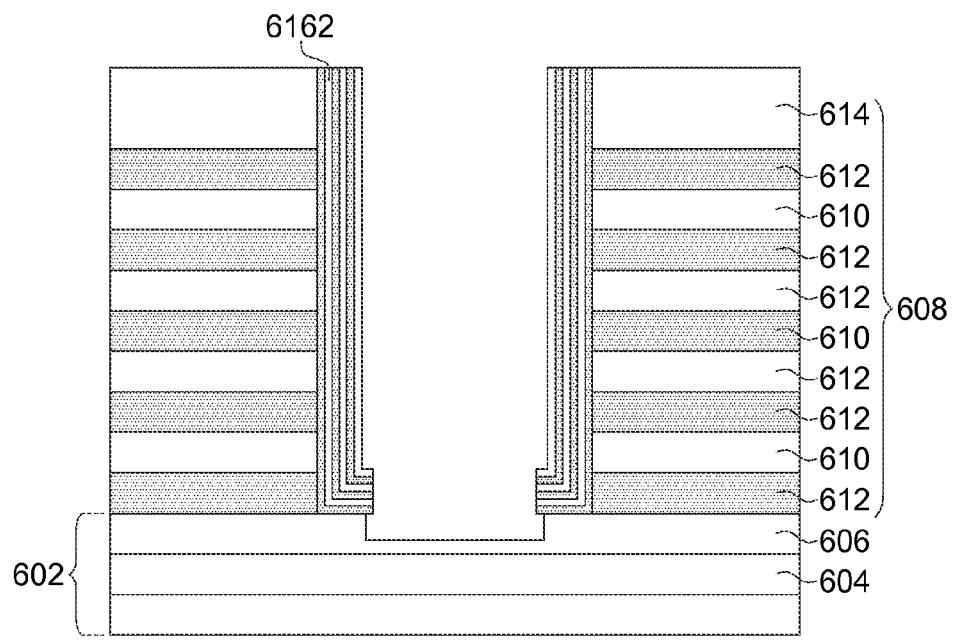

Referring to FIG. 6D, the conformal dummy channel layer 6220 and the conformal memory layer 6160 are separated. As such, a main portion 6162 of each of memory layers and dummy channel layers 622 are formed. The main portions 6162 of the memory layers are formed on sidewalls of the stacks 608, respectively. The dummy channel layers 622 are formed on the main portion 6162 of each of the memory layers, respectively. The separation process may be conducted by etching, such as dry etching. Then, as shown in FIG. 6E, the dummy channel layers 622 are removed, and the outer nitride layers of the main portions 6162 of the memory layers are exposed. The removing process may be conducted by etching using dilute NH$_4$OH. In some cases, the silicon substrate 602 may also be etched. However, the main portions 6162 of the memory layers will keep intact.

Figure 6F:
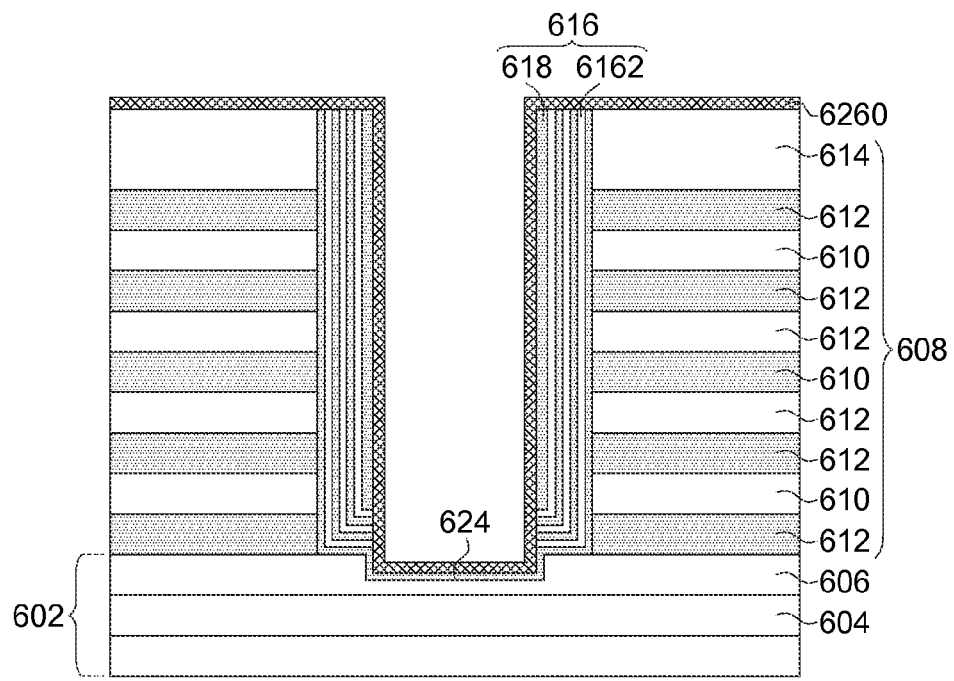

Referring to FIG. 6F, a remaining portion 618 of each of the memory layers 616 are formed. In one embodiment, a memory layer 616 being formed comprises a blocking layer, a trapping layer and a tunneling layer. According to one embodiment, the remaining portions 618 (an oxide layer) of the memory layers 616 may be formed by ISSG oxidation of the outer nitride layers of main portions 6162 of the memory layers. Concurrently, an oxide 624 may be formed on the exposed portions of the substrate 602. In one example, the oxide layer of the memory layers 616 formed by this ISSG oxidation process has a thickness of about 10 Å to about 13 Å, and the oxide 624 has a thickness of about 30 Å. In one embodiment, before the ISSG oxidation process, a dip process using DHF may be optionally conducted to remove naturally growing oxide. In this embodiment, since the outer oxide layer of the memory layer is formed by an additional process after an etching process, even though the oxide layer is very thin such as only about 10 Å to about 20 Å (an oxide layer of a typical memory layer is about, for example, 50 Å), it will not be damaged by the etching process.

A conformal channel layer 6260 is formed over the stacks 608 and the memory layers 616. The conformal channel layer 6260 may be formed of polysilicon. The conformal channel layer 6260 may be formed by deposition. In one example, the conformal channel layer 6260 has a thickness of about 80 Å.

Figure 6G:
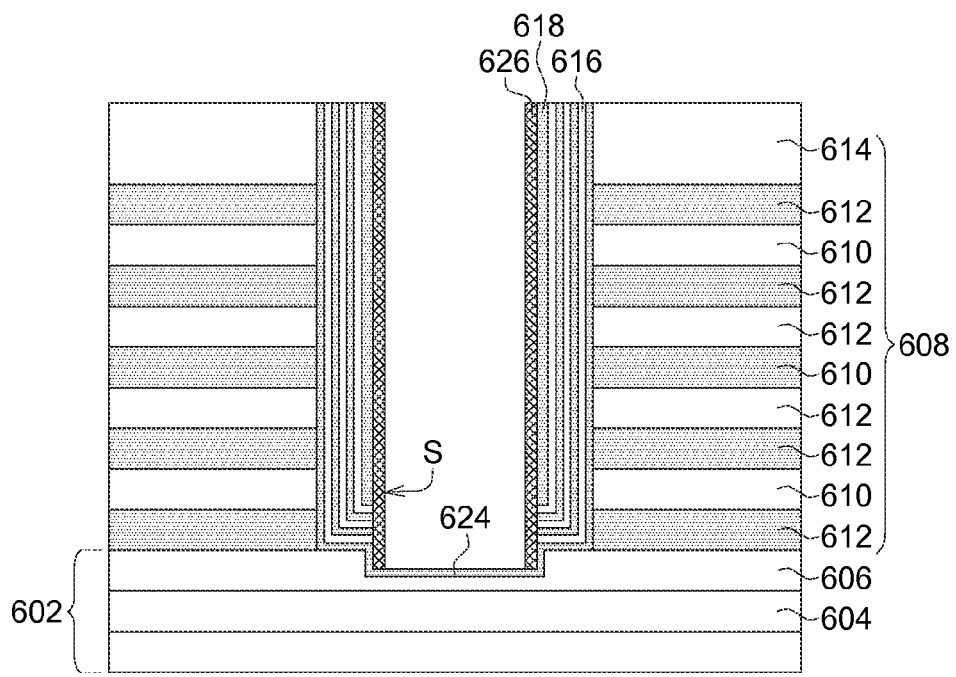

Referring to FIG. 6G, the conformal channel layer 6260 is separated. As such, a plurality of channel layers 626 are formed. The channel layers 626 are formed on the memory layers 616, respectively. A surface S of each of the channel layers 626 is exposed. The separation process may be conducted by etching. In this etching process, the channel layers 626 almost or completely keep intact. That is, the method according to this embodiment has the advantage relating the completeness of the channel layers.

Figure 6H:
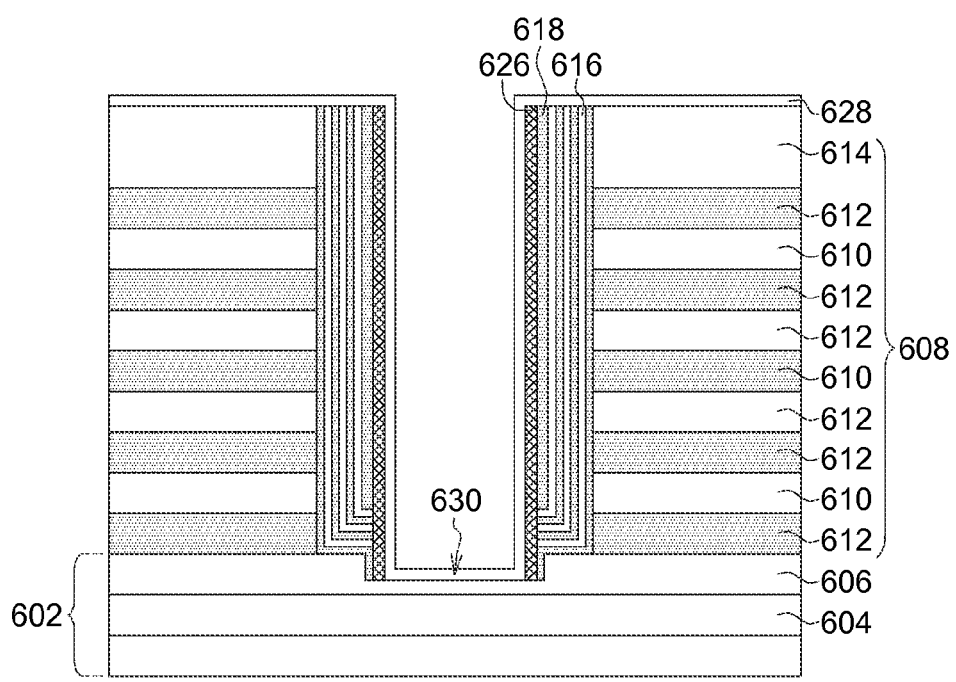

Referring to FIG. 6H, the oxide 624 is removed by, for example, a dip process using DHF. Then, a connecting layer 628 is formed on the channel layers 626, and the connecting layer 628 further extends from the channel layers 626 to the substrate 602. The connecting layer 628 comprises connecting portions 630 connecting the surface S of each of the channel layers 626 to the substrate 602, respectively. More specifically, the connecting portions 630 are connected to the source line 606. The connecting layer 628 may be formed of polysilicon. The connecting layer 628 may be formed by a deposition over the whole structure.

Figure 6I:
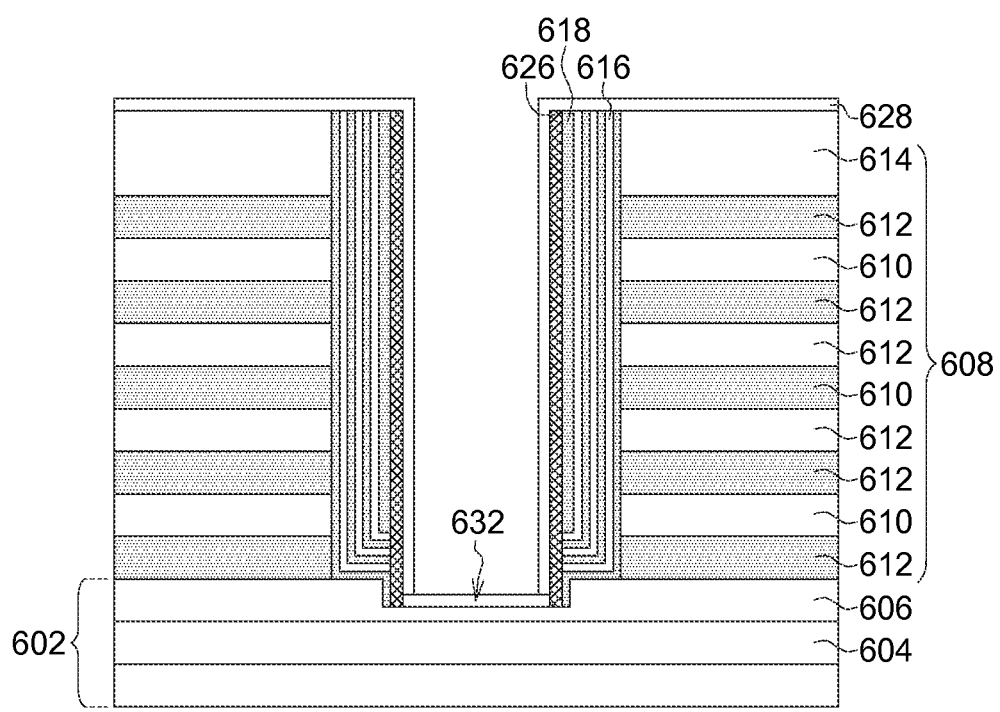

Referring to FIG. 6I, the connecting portions 630 may be transformed to be n-type heavily doped. According to one embodiment, the doped connecting portions 632 may be formed by rapid thermal treating. By this process, dopants are diffused from the n-type heavily doped source line 606 toward the channel layers 626. In an alternate embodiment, implantation may be conducted.

The semiconductor structure manufactured by the method according to this embodiment comprises a substrate 602, a plurality of stacks 608, a plurality of memory layers 616, a plurality of channel layers 626 and a connecting layer 628. The substrate 602 may comprise a buried layer 604 and a source line 606 formed on the buried layer 604. The stacks 608 are disposed on the substrate 602. Each of the stacks 608 comprises alternately-stacked conductive layers 610 and insulating layers 612. The memory layers 616 are disposed on sidewalls of the stacks 608, respectively. The channel layers 626 are disposed on the memory layers 616, respectively, wherein each of the channel layers 626 comprises a surface S being exposed. The connecting layer 628 is disposed on the channel layers 626, and further extends from the channel layers 626 to the substrate 602. The connecting layer 628 comprises connecting portions 632 connecting the surface S of each of the channel layers 626 to the substrate 602, respectively. More specifically, the connecting portions 632 connect the surface S of each of the channel layers 626 to the source line 606, respectively. The connecting portions 632 may be n-type heavily doped. For simplicity, other features are not reproduced here.

According to the embodiments, the channel layers formed on the sidewalls of the stacks can be connected to the substrate in a simple way while keep the desired configuration of the structure (such as no damage on the channel layers and the memory layers). The semiconductor structure of the embodiments may, but not limited to, a 3D memory, such as a 3D single-gate vertical channel memory (such as the cases of FIGS. 4A-6I) or a 3D NAND memory (such as the cases of FIGS. 1A-3J), with line pattern or hole pattern.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for manufacturing a semiconductor structure, comprising:
    forming a plurality of stacks on a substrate;
    forming a conformal memory layer over the stacks;
    forming a conformal channel layer over the conformal memory layer;
    forming a spacer layer on the conformal channel layer; and
    separating the spacer layer, the conformal channel layer and the conformal memory layer so as to form a plurality of memory layers, a plurality of channel layers and a plurality of spacers, wherein the memory layers are respectively formed on sidewalls of the stacks, the channel layers are respectively formed on the memory layers, a surface of each of the channel layers is exposed, and the spacers are respectively formed on the channel layers and expose the surface of each of the channel layers; and
    forming a plurality of connecting portions connecting the surface of each of the channel layers to the substrate, respectively, wherein the connecting portions are selective epitaxial growing layers.

2. The method according to claim 1, wherein the substrate comprises a buried layer and a source line formed on the buried layer, and the connecting portions are connected to the source line.

3. The method according to claim 2, wherein the connecting portions are n-type heavily doped.

4. The method according to claim 1, further comprising:
    removing the spacers remaining on the channel layers; and
    forming a connecting layer on the channel layers, the connecting layer further extending from the channel layers to the substrate, the connecting layer comprising the connecting portions.

5. The method according to claim 4, wherein the substrate comprises a buried layer and a source line formed on the buried layer, and the connecting portions are connected to the source line.

6. The method according to claim 5, wherein the connecting portions are n-type heavily doped.

7. The method according to claim 1, wherein the substrate is p-type doped, and the method further comprises:
forming a plurality of selective epitaxial growing layers on the substrate between the stacks.

8. The method according to claim 1, wherein each of the stacks comprises alternately-stacked conductive layers and insulating layers.

9. The method according to claim 1, wherein each of the stacks comprises alternately-stacked sacrificial layers and insulating layers.

10. A semiconductor structure, comprising:
a substrate;
a plurality of stacks disposed on the substrate, wherein each of the stacks comprises alternately-stacked conductive layers and insulating layers;
a plurality of memory layers disposed on sidewalls of the stacks, respectively;
a plurality of channel layers disposed on the memory layers, respectively, wherein each of the channel layers comprises a surface being exposed;
a plurality of spacers disposed on the channel layers, respectively; and
a plurality of connecting portions connecting the surface of each of the channel layers to the substrate, respectively, wherein the connecting portions are selective epitaxial growing layers.

11. The semiconductor structure according to claim 10, wherein the substrate comprises a buried layer and a source line formed on the buried layer, and the connecting portions are connected to the source line.

12. The semiconductor structure according to claim 11, wherein the connecting portions are n-type heavily doped.

* * * * *